(12) United States Patent
Shin et al.

(10) Patent No.: US 11,923,383 B2
(45) Date of Patent: Mar. 5, 2024

(54) PHOTOMASK, DISPLAY DEVICE, AND MANUFACTURING METHOD THEREOF

(71) Applicant: Samsung Display Co., Ltd., Yongin-Si (KR)

(72) Inventors: Dong Hee Shin, Asan-si (KR); Geun Ho Lee, Hwaseong-si (KR); Yong Hee Lee, Suwon-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 640 days.

(21) Appl. No.: 17/125,836

(22) Filed: Dec. 17, 2020

(65) Prior Publication Data
US 2021/0305287 A1    Sep. 30, 2021

(30) Foreign Application Priority Data
Mar. 25, 2020    (KR) ........................ 10-2020-0036267

(51) Int. Cl.
*H01L 27/12*    (2006.01)
*G03F 1/42*    (2012.01)
(Continued)

(52) U.S. Cl.
CPC ............ *H01L 27/1288* (2013.01); *G03F 1/42* (2013.01); *G03F 1/70* (2013.01); *G03F 7/0007* (2013.01);
(Continued)

(58) Field of Classification Search
CPC .. G03F 7/2022; G03F 7/70425; G03F 7/0007; G03F 7/70683; G03F 1/44; G03F 7/70633; G03F 1/42; G03F 7/70475; G03F 1/70; H01L 23/544; H01L 27/1288; H01L 2223/54426; H01L 2223/54493; H01L 2223/54486; G02F 1/1303; H10K 77/111; H10K 59/40; H10K 59/131; H10K 59/88; H10K 59/1201; H10K 2102/311; G06F 3/0412; G06F 3/0445; G06F 2203/04102; G06F 2203/04103; Y02E 10/549; Y02P 70/50
(Continued)

(56) References Cited

U.S. PATENT DOCUMENTS 5,850,276 A * 12/1998 Ochi .................. G02F 1/133526
349/158
2004/0194556 A1 * 10/2004 Shu ..................... G03F 7/70983
430/5

(Continued)

FOREIGN PATENT DOCUMENTS

JP    2008-277463 A    11/2008
JP    5554906 B2    7/2014
(Continued)

*Primary Examiner* — Mouloucoulaye Inoussa
(74) *Attorney, Agent, or Firm* — Innovation Counsel LLP

(57) ABSTRACT

A photomask according to an exemplary embodiment includes: a mask substrate; and a first test pattern and a second test pattern disposed along a first edge of the mask substrate, wherein the first test pattern has a first outer shape and a first inner shape, the second test pattern has a second outer shape, and the second outer shape of the second test pattern is larger than the first inner shape of the first test pattern and smaller than the first outer shape of the first test pattern.

7 Claims, 20 Drawing Sheets

(51) Int. Cl.
*G03F 1/70* (2012.01)
*G03F 7/00* (2006.01)
*G03F 7/20* (2006.01)
*H01L 23/544* (2006.01)

(52) U.S. Cl.
CPC .......... *G03F 7/2022* (2013.01); *H01L 23/544* (2013.01); *H01L 2223/54493* (2013.01)

(58) Field of Classification Search
USPC ........ 257/40, 21.211; 438/14, 795; 702/150; 716/52, 54
See application file for complete search history.

(56) References Cited

U.S. PATENT DOCUMENTS

| | | | | |
|---|---|---|---|---|
| 2005/0121628 A1* | 6/2005 | Aoyama | ............... | G03F 1/36 250/492.1 |
| 2006/0270179 A1* | 11/2006 | Yang | ............... | H01L 23/544 438/455 |
| 2007/0126334 A1* | 6/2007 | Nakamura | ............... | H01J 9/2271 313/484 |
| 2007/0275497 A1* | 11/2007 | Kwack | ............... | G03F 9/7088 438/60 |
| 2007/0290616 A1* | 12/2007 | Lee | ............... | H10K 50/80 313/506 |
| 2010/0211352 A1* | 8/2010 | Morinaga | ............... | G03F 9/7046 716/54 |
| 2011/0115057 A1* | 5/2011 | Harn | ............... | G03F 9/7084 257/E23.179 |
| 2011/0171768 A1* | 7/2011 | Hong | ............... | C23C 14/042 257/E33.001 |
| 2014/0033974 A1* | 2/2014 | Hong | ............... | B05C 21/005 118/500 |
| 2014/0353598 A1* | 12/2014 | Jeong | ............... | H01L 23/544 257/40 |
| 2016/0033880 A1* | 2/2016 | Kim | ............... | G03F 1/38 257/499 |
| 2016/0093684 A1* | 3/2016 | Youk | ............... | H10K 59/88 257/40 |
| 2017/0005015 A1* | 1/2017 | Li | ............... | H01L 22/12 |
| 2019/0317393 A1* | 10/2019 | Sun | ............... | G06F 30/39 |
| 2020/0168675 A1* | 5/2020 | Kim | ............... | H10K 71/00 |
| 2021/0372963 A1* | 12/2021 | Sizov | ............... | G01N 33/5438 |
| 2022/0357652 A1* | 11/2022 | Yu | ............... | G03F 1/38 |

FOREIGN PATENT DOCUMENTS

| | | |
|---|---|---|
| JP | 5753269 B2 | 7/2015 |
| KR | 20-1999-0034619 U | 8/1999 |
| KR | 10-2007-0000238 A | 1/2007 |

* cited by examiner

PHOTOMASK, DISPLAY DEVICE, AND MANUFACTURING METHOD THEREOF

CROSS-REFERENCE TO RELATED APPLICATION

This application claims priority to and the benefit of Korean Patent Application No. 10-2020-0036267 filed in the Korean Intellectual Property Office on Mar. 25, 2020, the disclosure of which is incorporated herein by reference in its entirety.

BACKGROUND

1. Field

The present disclosure relates to a photomask, a manufacturing method of a display device using the same, and a display device manufactured according thereto.

2. Description of the Related Art

A display device includes a liquid crystal display (LCD), an organic light emitting diode (OLED), and the like. The display device is used for displaying images in various electronic devices such as a mobile phone, a navigation device, a digital camera, an electronic book, a portable game machine, and various display terminals.

The display device may include various wires disposed in different layers during manufacturing processes. For example, the wires may be formed through processes such as a deposition process, a photo process, and an etching process. A photo process includes an exposure process and a development process, and a photomask may be used during the exposure process. A predetermined pattern is formed on the photomask. Light may not pass through a portion of the photomask in which a predetermined pattern is formed while light may pass through a portion on which the predetermined pattern is not formed.

When manufacturing a large-sized display device, wires may be formed by using a photomask corresponding to the size of the display device, or by shifting a photomask that is smaller than the display device and performing the exposure process multiple times. Misalignment of the photomask can form wires positioned at a boundary between the exposure regions differently from their originally designed shape.

The above information disclosed in this Background section is only for enhancement of understanding of the background of the present disclosure, and therefore it may contain information that does not form the prior art that is already known to a person of ordinary skill in the art.

SUMMARY

An exemplary embodiment of the present disclosure is to provide a photomask capable of checking whether a photomask is misaligned in a process of shifting a photomask and performing an exposure process, a manufacturing method of a display device using the same, and a display device manufactured according thereto.

A photomask according to an exemplary embodiment of the present disclosure includes: a mask substrate; and a first test pattern and a second test pattern disposed along a first edge of the mask substrate, wherein the first test pattern has a first outer shape and a first inner shape, the second test pattern has a second outer shape, and the second outer shape of the second test pattern is larger than the first inner shape of the first test pattern and smaller than the first outer shape of the first test pattern.

Each of the first outer shape of the first test pattern, the first inner shape of the first test pattern, and the second outer shape of the second test pattern may have a square shape, and a first length of one side of the second outer shape of the second test pattern may be longer than a second length of one side of the first inner shape of the first test pattern and shorter than a third length of one side of the first outer shape of the first test pattern.

The second test pattern may further have a second inner shape, and the second inner shape of the second test pattern may be smaller than the first inner shape of the first test pattern.

Each of the first outer shape of the first test pattern, the first inner shape of the first test pattern, the second outer shape of the second test pattern, and the second inner shape of the second test pattern may have a square shape, a first length of one side of the second outer shape of the second test pattern may be longer than a second length of one side of the first inner shape of the first test pattern and shorter than a third length of one side of the first outer shape of the first test pattern, and a fourth length of one side of the second inner shape of the second test pattern may be shorter than the second length of one side of the first inner shape of the first test pattern.

The photomask according to an exemplary embodiment further includes a third test pattern and a fourth test pattern disposed along a second edge facing the first edge of the mask substrate, the first test pattern and the third test pattern may be disposed on a first imaginary line that extends parallel to a third edge connecting the first edge and the second edge of the mask substrate, and the second test pattern and the fourth test pattern may be disposed on a second imaginary line that extends parallel to the third edge.

The third test pattern may have substantially the same shape as the first test pattern, and the fourth test pattern may have substantially the same shape as the second test pattern.

The first test pattern and the third test pattern are shifted in a direction perpendicular to the first imaginary line, the first test pattern may at least partially overlap the second test pattern, and the third test pattern may at least partially overlap the fourth test pattern.

A manufacturing method of a display device according to an exemplary embodiment of the present disclosure includes: forming a metal layer and a photoresist on a substrate; aligning a photomask on the substrate and irradiating light onto the photomask; repeating a process of shifting the photomask and irradiating the light onto the photomask; forming a test resist pattern on the display device by developing the photoresist; determining an alignment error of the photo mask based on a shape of the test resist pattern, and repeating processes of forming, aligning, irradiating, shifting, and developing based on determination of the alignment error; and etching the metal layer by using the photoresist as a mask, wherein the test resist pattern includes: a first test resist pattern, a second test resist pattern, and a third test resist pattern disposed along a first edge of the substrate, the third test resist pattern is disposed between the first test resist pattern and the second test resist pattern, the first test resist pattern has a first outer shape and a first inner shape, the third test resist pattern has a third outer shape and a third inner shape, and the second test resist pattern has a second outer shape.

The second outer shape of the second test resist pattern may be larger than the first inner shape of the first test resist pattern and smaller than the first outer shape of the first test resist pattern.

The third outer shape of the third test resist pattern may be the same as the second outer shape of the second test resist pattern, and the third inner shape of the third test resist pattern may be the same as the first inner shape of the first test resist pattern.

The substrate may include a plurality of markers disposed along the first edge of the substrate, and each of the plurality of markers may be disposed in the first test resist pattern, the second test resist pattern, and the third test resist pattern.

Each of the first outer shape of the first test resist pattern, the first inner shape of the first test resist pattern, and second outer shape of the second test resist pattern may have a square shape, and a first length of one side of the second outer shape of the second test resist pattern may be longer than a second length of one side of the first inner shape of the first test resist pattern and shorter than a third length of one side of the first outer shape of the first test resist pattern.

The second test resist pattern may further have a second inner shape, and the second inner shape of the second test resist pattern may be smaller than the first inner shape of the first test resist pattern.

Each of the first outer shape of the first test resist pattern, the first inner shape of the first test resist pattern, the second outer shape of the second test resist pattern, and the second inner shape of the second test resist pattern may have a square shape, a first length of one side of the second outer shape of the second test resist pattern may be longer than a second length of one side of the first inner shape of the first test resist pattern and shorter than a third length of one side of the first outer shape of the first test resist pattern, and a fourth length of one side of the second inner shape of the second test resist pattern may be shorter than the second length of one side of the first inner shape of the first test resist pattern.

Etching of the metal layer may include forming a first test metal pattern having substantially the same shape as the first test resist pattern, a second test metal pattern having substantially the same shape as the second test resist pattern, and a third test metal pattern having substantially the same shape as the third test resist pattern.

The test resist pattern may include a plurality of third test resist patterns.

A fourth test resist pattern, a fifth test resist pattern, and a sixth test resist pattern may be disposed along a second edge facing the first edge of the substrate, the sixth test resist pattern may be disposed between the fourth test resist pattern and the fifth test resist pattern, the fourth test resist pattern may have substantially the same shape as the first test resist pattern, the fifth test resist pattern may have substantially the same shape as the second test resist pattern, and the sixth test resist pattern may have substantially the same shape as the third test resist pattern.

A display device according to an exemplary embodiment of the present disclosure includes: a substrate; and a first test metal pattern, a second test metal pattern, and a third test metal pattern disposed along a first edge of the substrate, wherein the third test metal pattern is disposed between the first test metal pattern and the second test metal pattern, wherein the first test metal pattern has a first outer shape and a first inner shape, wherein the third test metal pattern has a third outer shape and a third inner shape, and wherein the second test metal pattern has a second outer shape.

The second outer shape of the second test metal pattern may be larger than the first inner shape of the first test metal pattern and smaller than the first outer shape of the first test metal pattern.

The third outer shape of the third test metal pattern may be the same as the second outer shape of the second test metal pattern, and the third inner shape of the third test metal pattern may be the same as the first inner shape of the first test metal pattern.

The substrate may include a plurality of markers disposed along the first edge of the substrate, and each of the plurality of markers may be disposed in the first test metal pattern, the second test metal pattern, and the third test metal pattern.

The display device according to an exemplary embodiment further includes: a gate electrode disposed on the substrate; a semiconductor overlapping the gate electrode; a source electrode and a drain electrode disposed on the semiconductor and separated from each other; and a pixel electrode connected to the drain electrode, wherein the first test metal pattern, the second test metal pattern, and the third test metal pattern may be disposed on the same layer as the source electrode, the drain electrode, or the pixel electrode.

According to exemplary embodiments of the present disclosure, wires may be formed to have a shape that is originally designed by checking an alignment error of the photomask that may occur during a division exposure process by shifting the photomask.

DETAILED DESCRIPTION

Figure 1:
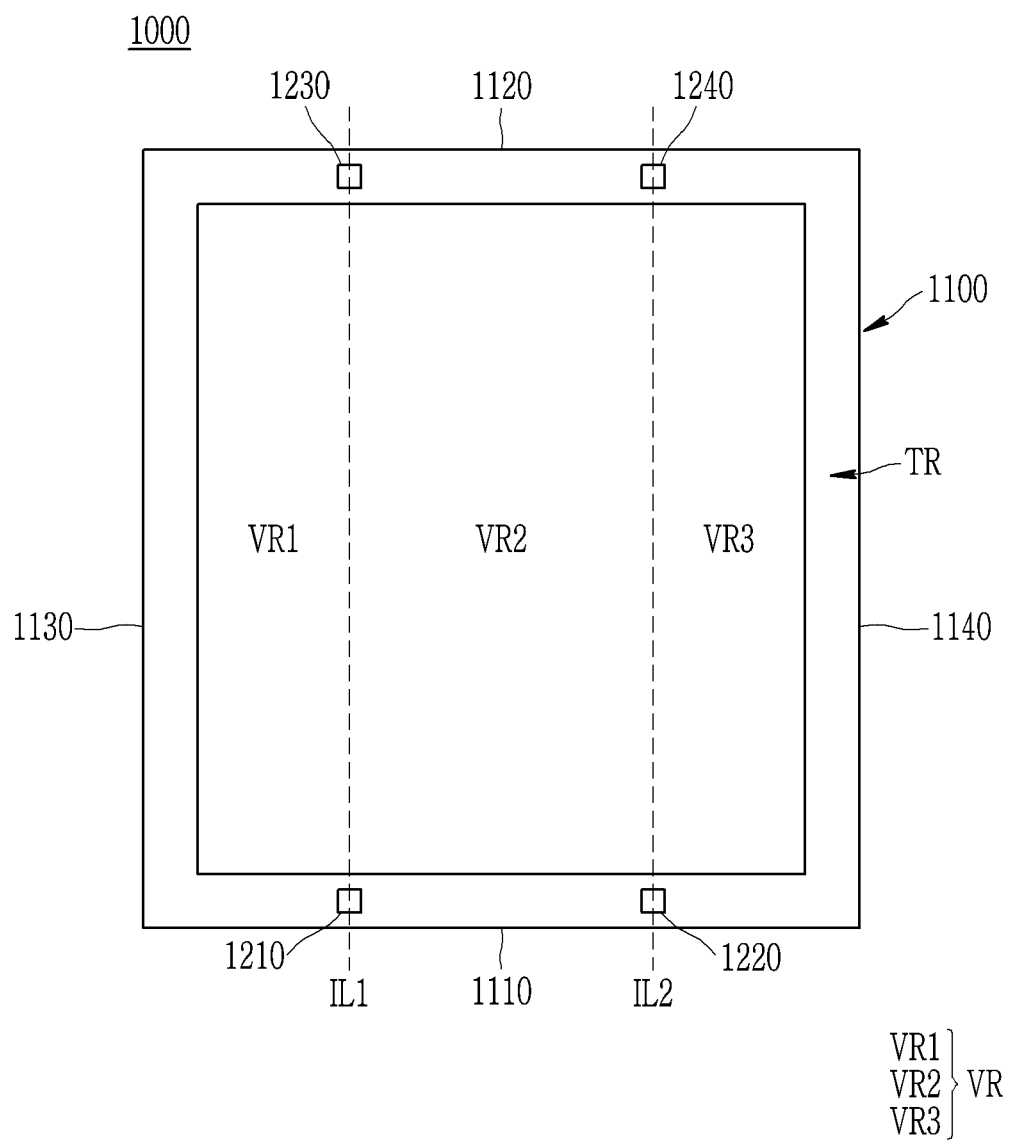
FIG. 1 is a top plan view showing a photomask according to an exemplary embodiment.

The present disclosure will be described more fully hereinafter with reference to the accompanying drawings, in which exemplary embodiments of the present disclosure are shown. As those skilled in the art would realize, the exemplary embodiments may be modified in various different ways, without departing from the spirit or scope of the present disclosure.

The drawings and description are to be regarded as illustrative in nature and not restrictive, and like reference numerals designate like elements throughout the present disclosure.

In addition, sizes and/or thicknesses of each configuration shown in the drawings are arbitrarily shown for understanding and ease of description, but the present disclosure is not limited thereto. In the drawings, the sizes and/or thicknesses of layers, areas, films, panels, regions, etc., may be exaggerated for clarity, better understanding, and/or ease of description.

In addition, it will be understood that when an element such as a layer, film, region, or substrate is referred to as being "on" another element, it can be directly on the other element, or one or more intervening elements may also be present therebetween. In contrast, when an element is referred to as being "directly on" another element, there may be no intervening elements present therebetween. Further, the term "on" or "above" means positioned on or below an object, and does not necessarily mean positioned on the upper side of the object based on a gravitational direction.

In addition, unless explicitly described to the contrary, the term "comprise", and its variations such as "comprises" or "comprising" will be understood to imply an inclusion of stated elements but not an exclusion of any other elements.

Further, throughout the present disclosure, the phrase "on a plane" means viewing a target portion from the top, and the phrase "on a cross-section" means viewing a cross-section formed by vertically cutting a target portion from the side.

Now, a photomask according to an exemplary embodiment is described with reference to FIG. 1.

FIG. 1 is a top plan view of a photomask according to an exemplary embodiment.

As shown in FIG. 1, a photomask 1000 according to an exemplary embodiment includes a mask substrate 1100, and a first test pattern 1210 and a second test pattern 1220 disposed in the mask substrate 1100.

The mask substrate 1100 may be made of a material including, but not limited to, transparent glass and plastic. The mask substrate 1100 may have a shape including, but not limited to, a quadrangular shape and a rectangular shape. In a case where the mask substrate 100 has a rectangular shape, the lengths of facing edges of the mask substrate 1100 may be substantially the same. For example, the length of a first edge 1110 of the mask substrate 1100 may be substantially the same as the length of a second edge 1120 facing the first edge 1110. In addition, the length of a third edge 1130 connecting the first edge 1110 and the second edge 1120 may be substantially the same as the length of a fourth edge 1140 facing the third edge 1130.

The first edge 1110 may correspond to a lower edge, the second edge 1120 may correspond to an upper edge, the third edge 1130 may correspond to a left edge, and the fourth edge 1140 may correspond to a right edge.

The mask substrate 1100 may include a valid pattern formation region VR and a test pattern formation region TR that surrounds the valid pattern formation region VR. The valid pattern formation region VR may be disposed at a center of the mask substrate 1100, and may include a first region VR1, a second region VR2, and a third region VR3. The first region VR1, the second region VR2, and the third region VR3 may be sequentially disposed from left to right. In this case, the second region VR2 may be disposed between the first region VR1 and the third region VR3. A first imaginary line IL1 may be defined to extend along the boundary between the first region VR1 and the second region VR2. The first imaginary line IL1 may be parallel to the third edge 1130 or the fourth edge 1140. A second imaginary line IL2 may be defined to extend along the boundary between the second region VR2 and the third region VR3. The second imaginary line IL2 may be parallel to the third edge 1130 or the fourth edge 1140. The test pattern formation region TR may be disposed at one or more edges of the mask substrate 1100. The test pattern formation region TR may be disposed along the first edge 1110, the second edge 1120, the third edge 1130, and the fourth edge 1140 of the mask substrate 1100 and may surround the first region VR1, the second region VR2, and the third region VR3.

Although not shown, a plurality of patterns may be disposed in the valid pattern formation region VR of the mask substrate 1100. The photomask 1000 may be used in a wiring forming process of a display device, and a plurality of patterns for forming wires of the display device may be disposed in the valid pattern formation region VR.

In the test pattern formation region TR of the mask substrate 1100, the first test pattern 1210 and the second test pattern 1220 may be disposed. The first test pattern 1210 and the second test pattern 1220 may be disposed along one of the edges of the mask substrate 100, for example, the first edge 1110. The first test pattern 1210 may be disposed on the first imaginary line Ill, and the second test pattern 1220 may be disposed on the second imaginary line IL2.

The photomask 1000 according to an exemplary embodiment may further include a third test pattern 1230 and a fourth test pattern 1240. The third test pattern 1230 and the fourth test pattern 1240 may be disposed in the test pattern formation region TR of the mask substrate 1100. The third test pattern 1230 and fourth test pattern 1240 may be disposed along the second edge 1120 of the mask substrate 1100. The third test pattern 1230 may be disposed on the first imaginary line IL1. The fourth test pattern 1240 may be disposed on the second imaginary line IL2.

The first test pattern 1210 and the third test pattern 1230 may be disposed at opposite ends of the first imaginary line IL1. The second test pattern 1220 and the fourth test pattern 1240 may be disposed at opposite ends of the second imaginary line IL2. The valid pattern formation region VR may be disposed between the first test pattern 1210 and the third test pattern 1230 and between the second test pattern 1220 and the fourth test pattern 1240.

The first test pattern 1210 and the second test pattern 1220 may have different shapes. The first test pattern 1210 and the second test pattern 1220 may have substantially the same shape with different sizes. If the first test pattern 1210 is shifted in a direction perpendicular to the first imaginary line ILL it may at least partially overlap the second test pattern 1220.

The third test pattern 1230 and the fourth test pattern 1240 may have different shapes. The third test pattern 1230 and the fourth test pattern 1240 may have substantially the same shape with different sizes. If the third test pattern 1230 is shifted in a direction perpendicular to the first imaginary line ILL it may at least partially overlap with the fourth test pattern 1240.

The third test pattern 1230 may have substantially the same shape and/or size as the first test pattern 1210. The fourth test pattern 1240 may have substantially the same shape and/or size as the second test pattern 1220.

However, the present exemplary embodiment is not limited thereto. The first test pattern 1210 and the third test pattern 1230 may have different shapes and/or sizes, and the second test pattern 1220 and the fourth test pattern 1240 may have different shapes and/or sizes. For example, the third test pattern 1230 may have substantially the same shape and size as the second test pattern 1220. In addition, the fourth test pattern 1240 may have substantially the same shape and size as the first test pattern 1210.

Hereinafter, an example shape of the first test pattern 1210 and the second test pattern 1220 of the photomask 1000 according to an exemplary embodiment is described with reference to FIG. 2.

Figure 2:
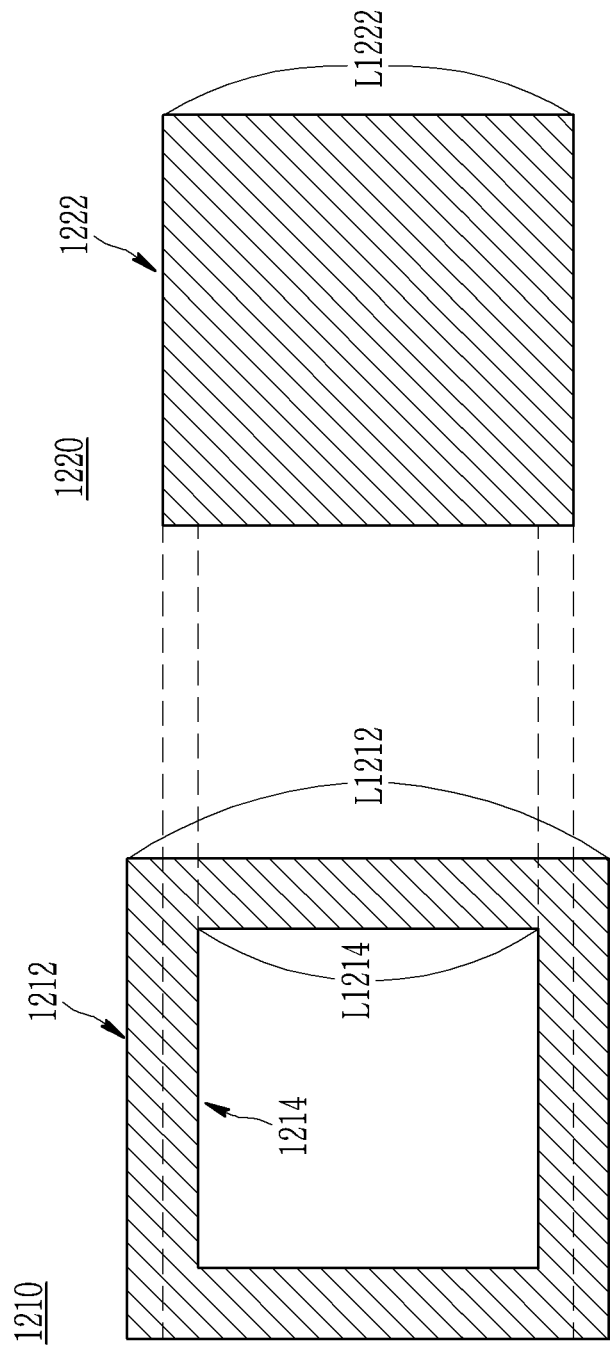
FIG. 2 is a top plan view showing a first test pattern and a second test pattern of a photomask according to an exemplary embodiment.

FIG. 2 is a top plan view showing a first test pattern and a second test pattern of a photomask according to an exemplary embodiment.

Referring to FIG. 2, the first test pattern 1210 may have a ring shape. The ring shape may refer to a closed loop shape including an outer shape 1212 and an inner shape 1214. The outer shape 1212 and the inner shape 1214 of the first test pattern 1210 may have various shapes. For example, the outer shape 1212 and the inner shape 1214 of the first test pattern 1210 may have a quadrangle shape. In the example shown in FIG. 2, the first test pattern 1210 has a square ring shape. In this case, each of the outer shape 1212 and the inner shape 1214 of the first test pattern 1210 may have a square shape. Since the outer shape 1212 of the first test pattern 1210 is larger than the inner shape 1214, a length L1212 of one side of the outer shape 1212 of the first test pattern 1210 is longer than a length L1214 of one side of the inner shape 1214 of the first test pattern 1210.

The second test pattern 1220 may have a polygon shape. For example, the second test pattern 1220 may have a quadrangle shape. The outer shape 1222 of the second test pattern 1220 may have a quadrangle shape, and the second test pattern 1220 may not have an inner shape. That is, the second test pattern 1220 may have a quadrangle shape that is filled inside. For example, the second test pattern 1220 may have a square shape.

The outer shape 1222 of the second test pattern 1220 may be larger than the inner shape 1214 of the first test pattern 1210 and may be smaller than the outer shape 1212 of the first test pattern 1210. Accordingly, a length L1222 of one side of the outer shape 1222 of the second test pattern 1220 may be longer than the length L1214 of one side of the inner shape 1214 of the first test pattern 1210 and may be shorter than the length L1212 of one side of the outer shape 1212 of the first test pattern 1210.

If the first test pattern 1210 is shifted in a direction perpendicular to the first imaginary line IL1 toward the second test pattern 1220, it may at least partially overlap the second test pattern 1220. In this case, the second test pattern 1220 may be disposed inside the outer shape 1212 of the first test pattern 1210, and the inner shape 1214 of the first test pattern 1210 may be disposed inside the second test pattern 1220.

The shape of the first test pattern 1210 and the second test pattern 1220 of the photomask 1000 according to an exemplary embodiment is not limited to this example and may be variously changed without deviating from the scope of the present disclosure. Hereinafter, other examples of the first test pattern 1210 and the second test pattern 1220 of the photomask 1000 according to an exemplary embodiment are described with reference to FIG. 3 and FIG. 4.

Figure 3:
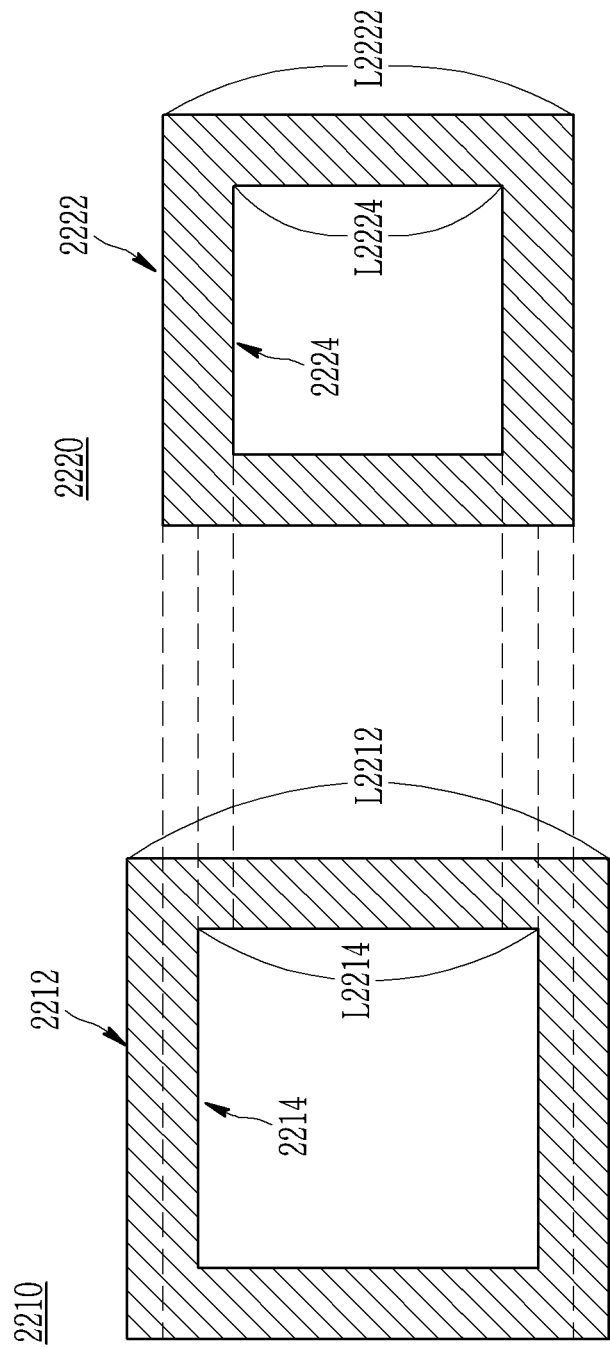
FIG. 3 and FIG. 4 are top plan views showing an exemplary variation of a first test pattern and a second test pattern of a photomask according to an exemplary embodiment.
Figure 4:
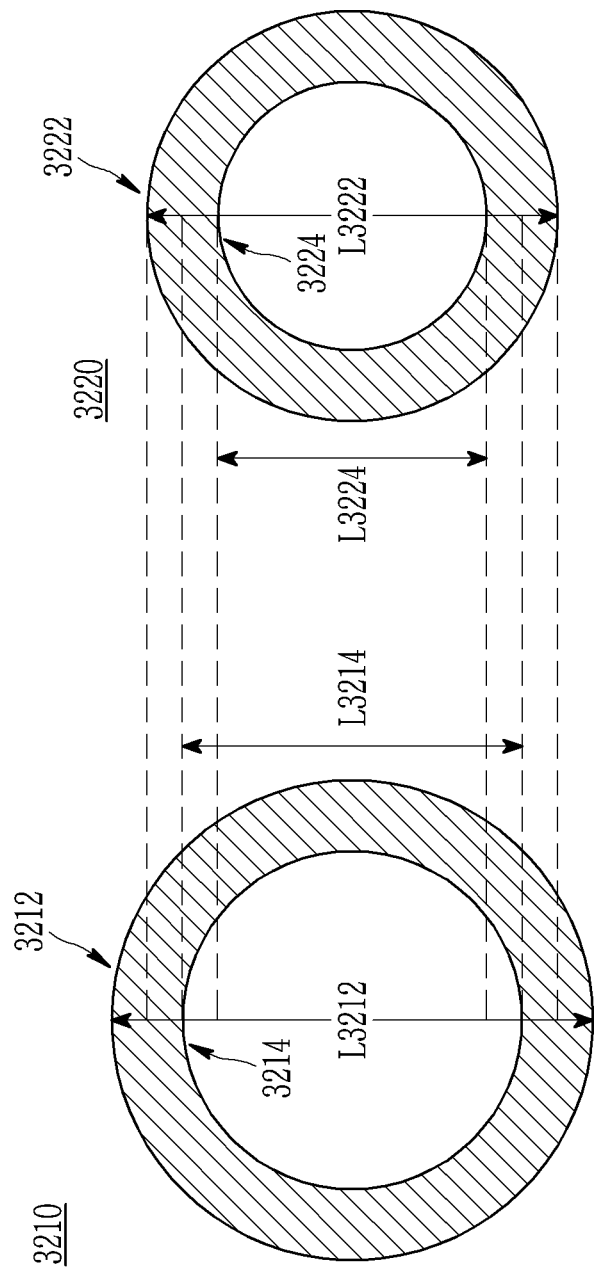

FIG. 3 and FIG. 4 are top plan views showing an exemplary variation of the first test pattern 1210 and the second test pattern 1220 of the photomask 1000 according to an exemplary embodiment.

Referring to FIG. 3, a first test pattern 2210 may have a ring shape. An outer shape 2212 and an inner shape 2214 of the first test pattern 2210 may have a quadrangle shape, respectively. In the example shown in FIG. 3, the first test pattern 2210 has a square ring shape. In this case, the outer shape 2212 and the inner shape 2214 of the first test pattern 2210 may have a square shape, respectively. Since the outer shape 2212 of the first test pattern 2210 is larger than the inner shape 2214, a length L2212 of one side of the outer shape 2212 of the first test pattern 2210 is longer than a length L2214 of one side of the inner shape 2214 of the first test pattern 2210. The second test pattern 2220 may have a ring shape. An outer shape 2222 and an inner shape 2224 of the second test pattern 2220 may have a quadrangle shape, respectively. In the example shown in FIG. 3, the second test pattern 2220 has a square ring shape. In this case, the outer shape 2222 and the inner shape 2224 of the second test pattern 2220 may have a square shape, respectively. Since the outer shape 2222 of the second test pattern 2220 is larger than the inner shape 2224, a length L2222 of one side of the outer shape 2222 of the second test pattern 2220 is longer than a length L2224 of one side of the inner shape 2224 of the second test pattern 2220.

The outer shape 2222 of the second test pattern 2220 may be larger than the inner shape 2214 of the first test pattern 2210 and may be smaller than the outer shape 2212 of the first test pattern 2210. In this case, the length L2222 of one side of the outer shape 2222 of the second test pattern 2220 may be longer than the length L2214 of one side of the inner shape 2214 of the first test pattern 2210 and may be shorter than the length L2212 of one side of the outer shape 2212 of the first test pattern 2210. The inner shape 2224 of the second test pattern 2220 may be smaller than the inner shape 2214 of the first test pattern 2210. In this case, the length L2224 of one side of the inner shape 2224 of the second test pattern 2220 may be shorter than the length L2214 of one side of the inner shape 2214 of the first test pattern 2210.

If the first test pattern 2210 is shifted in a direction perpendicular to the first imaginary line IL1 toward the second test pattern 2220, it may at least partially overlap the second test pattern 2220. In this case, the outer shape 2222 of the second test pattern 2220 may be disposed inside the outer shape 2212 of the first test pattern 2210, the inner shape 2214 of the first test pattern 2210 may be disposed inside the outer shape 2222 of the second test pattern 2220, and the inner shape 2224 of the second test pattern 2220 may be disposed inside the inner shape 2214 of the first test pattern 2210.

Referring to FIG. 4, a first test pattern 3210 may have a ring shape. An outer shape 3212 and an inner shape 3214 of the first test pattern 3210 may have a circular shape. In the example shown in FIG. 4, the first test pattern 3210 has a circular ring shape. The outer shape 3212 of the first test pattern 3210 is larger than the inner shape 3214, so the diameter L3212 of the outer shape 3212 of the first test pattern 3210 is larger than the diameter L3214 of the inner shape 3214 of the first test pattern 3210.

The second test pattern 3220 may have a ring shape. An outer shape 3222 and an inner shape 3224 of the second test pattern 3220 may have a circular shape. In the example shown in FIG. 4, the second test pattern 3220 has a circular ring shape. The outer shape 3222 of the second test pattern 3220 is larger than the inner shape 3224, so the diameter L3222 of the outer shape 3222 of the second test pattern 3220 is larger than the diameter L3224 of the inner shape 3224 of the second test pattern 3220.

The outer shape 3222 of the second test pattern 3220 may be larger than the inner shape 3214 of the first test pattern 3210 and may be smaller than the outer shape 3212 of the first test pattern 3210. Therefore, the diameter L3222 of the outer shape 3222 of the second test pattern 3220 may be larger than the diameter L3214 of the inner shape 3214 of the first test pattern 3210 and may be smaller than the diameter L3212 of the outer shape 3212 of the first test pattern 3210. The inner shape 3224 of the second test pattern 3220 may be smaller than the inner shape 3214 of the first test pattern 3210. Therefore, the diameter L3224 of the inner shape 3224 of the second test pattern 3220 may be smaller than the diameter L3214 of the inner shape 3214 of the first test pattern 3210.

If the first test pattern 3210 is shifted in a direction perpendicular to the first imaginary line IL1 toward the second test pattern 3220, it may at least partially overlap the second test pattern 3220. In this case, the outer shape 3222 of the second test pattern 3220 may be disposed inside the outer shape 3212 of the first test pattern 3210, the inner shape 3214 of the first test pattern 3210 may be disposed inside the outer shape 3222 of the second test pattern 3220, and the inner shape 3224 of the second test pattern 3220 may be disposed inside the inner shape 3214 of the first test pattern 3210.

Next, a manufacturing method of a display device according to an exemplary embodiment is described with reference to FIG. 5 to FIG. 20.

Figure 12:
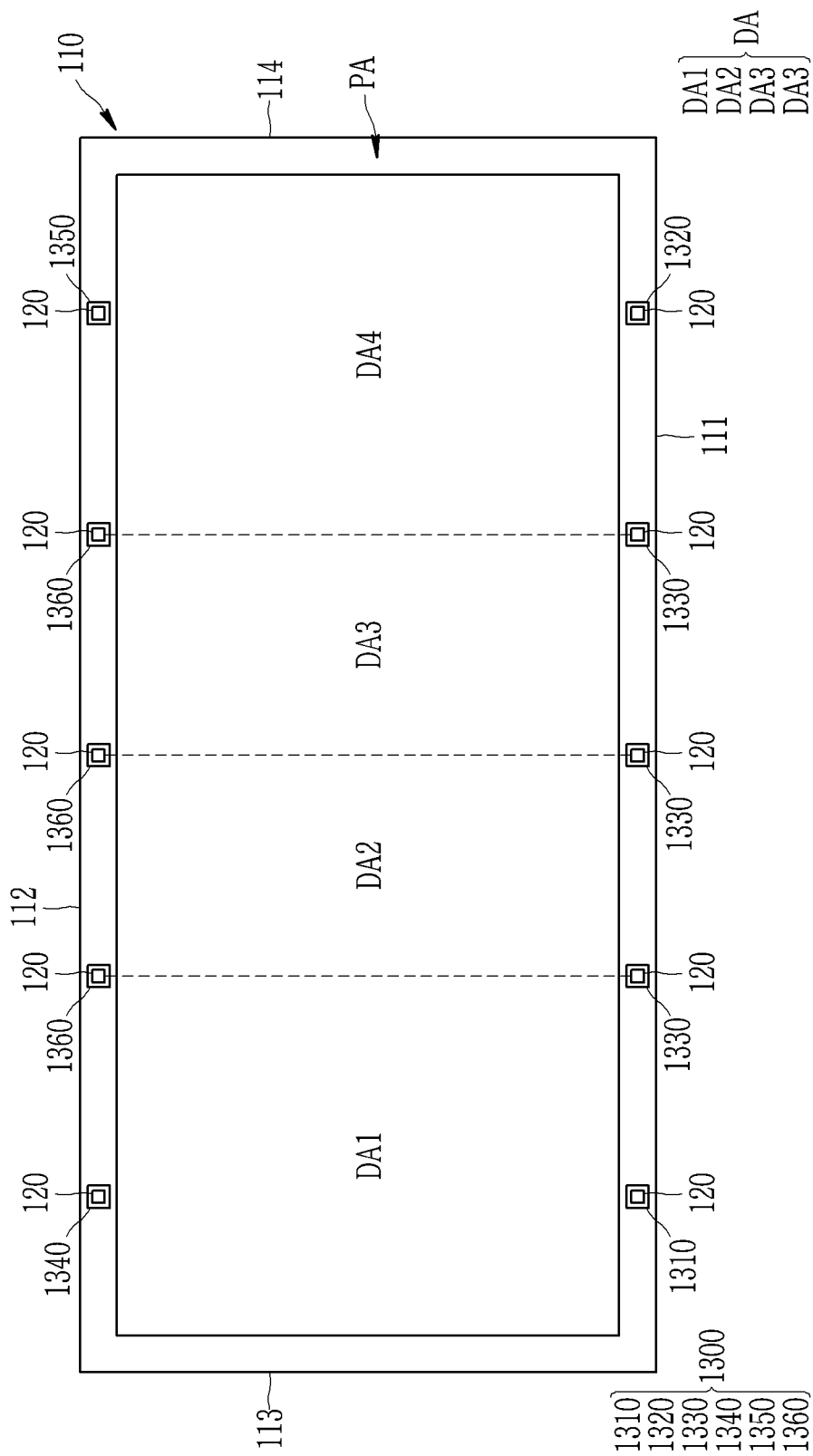
Figure 13:
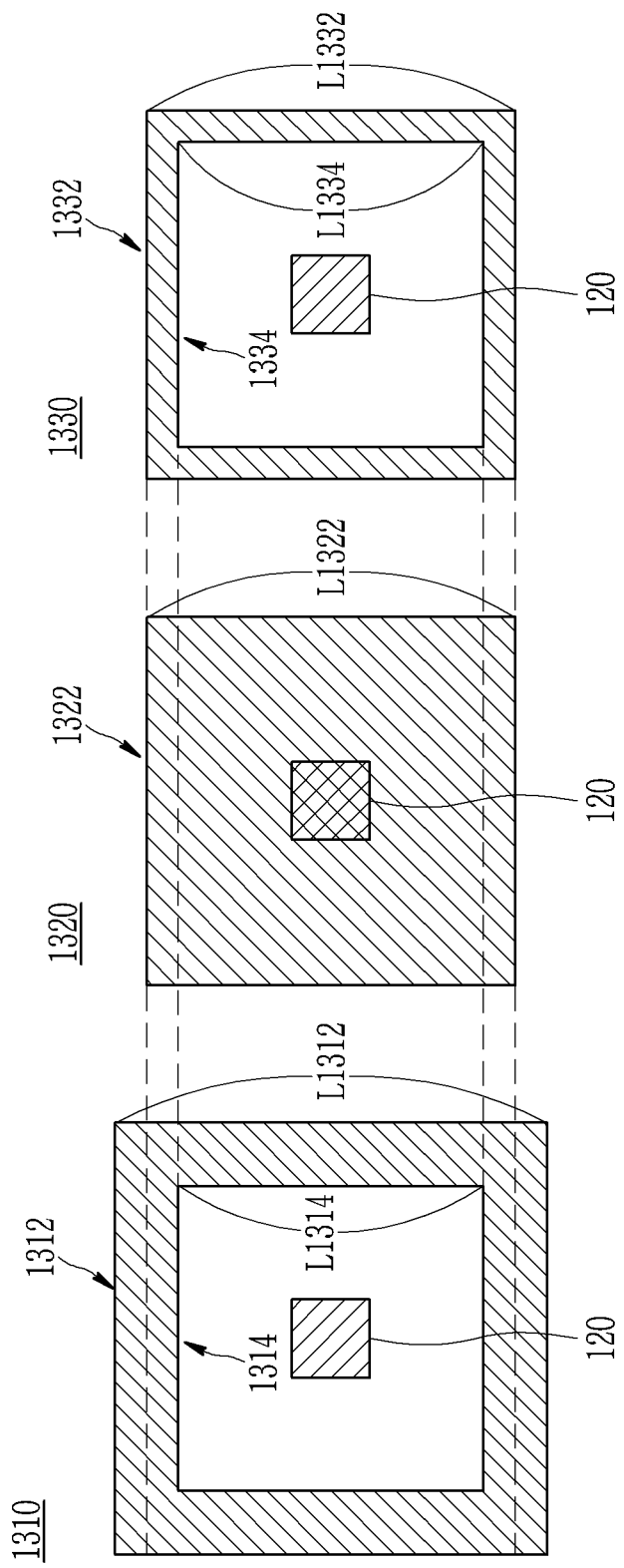
FIG. 13, FIG. 14, and FIG. 15 are top plan views showing a test resist pattern formed in a manufacturing process of a display device according to an exemplary embodiment.
Figure 14:
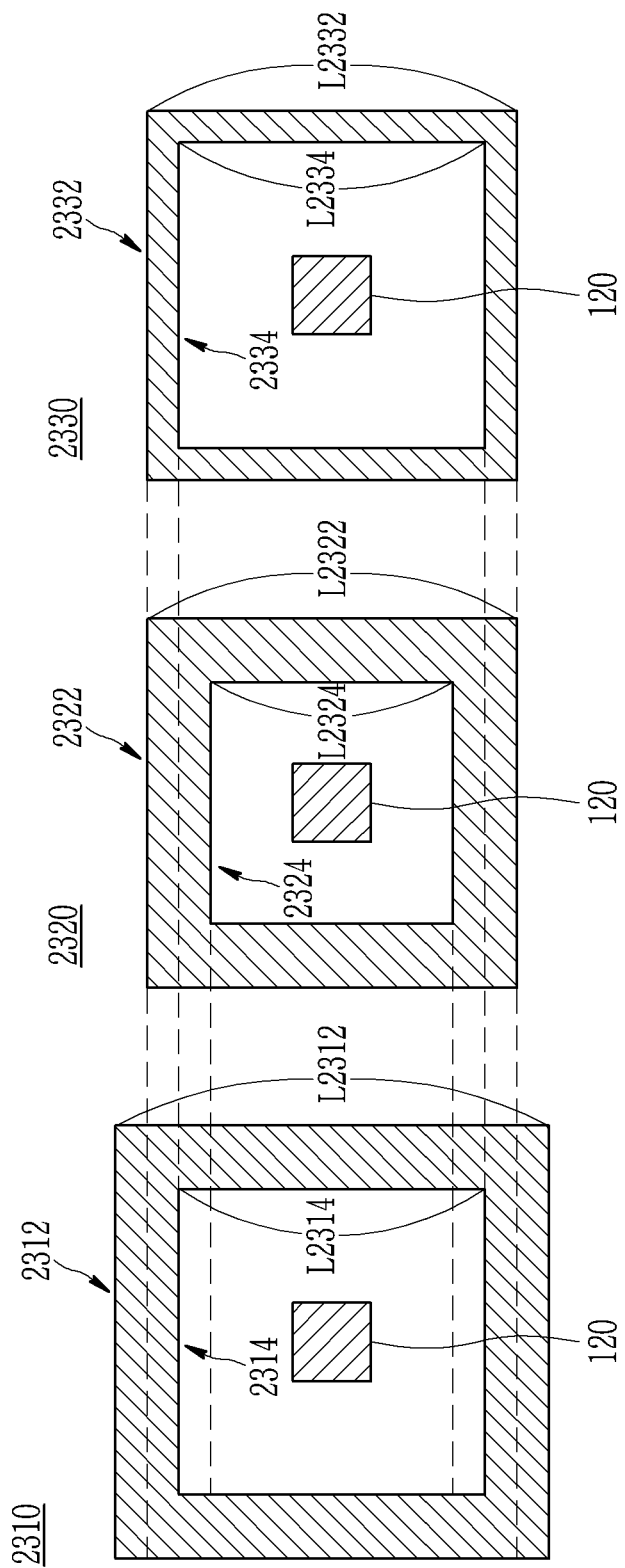
Figure 15:
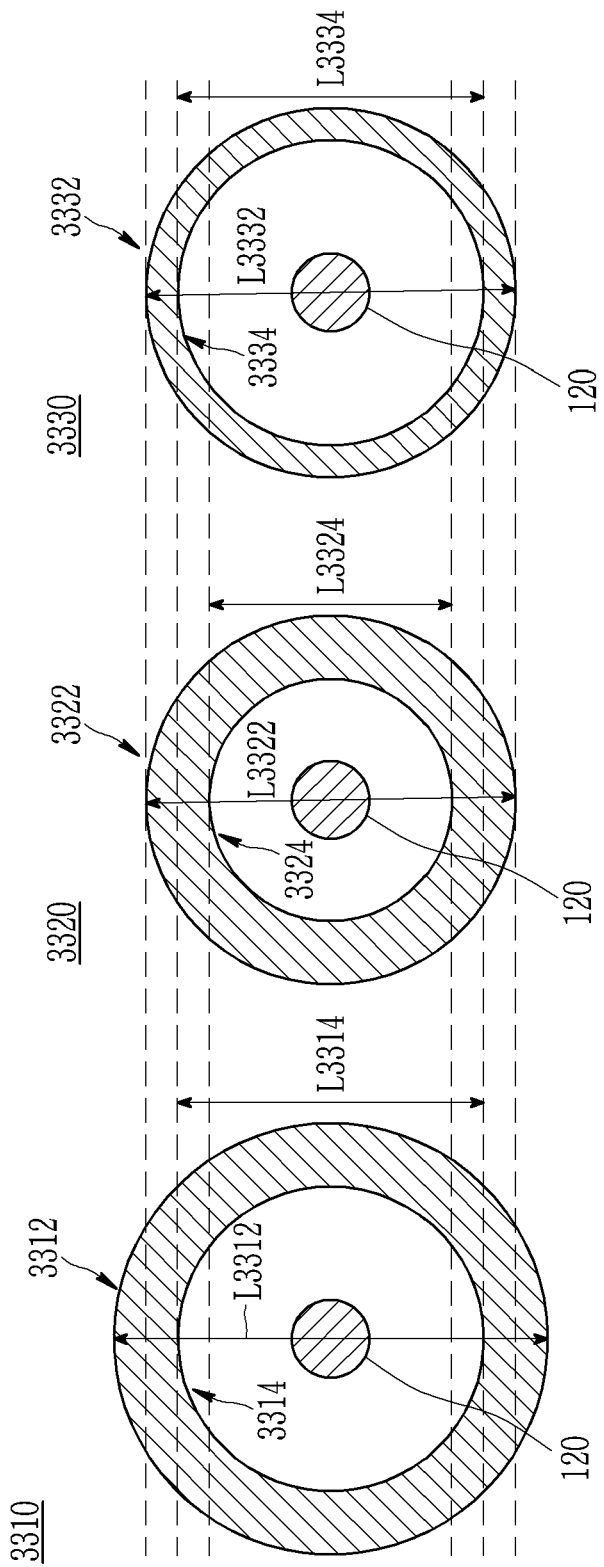

FIG. 5 to FIG. 20 are views explaining a manufacturing method of a display device according to an exemplary embodiment. FIG. 5 to FIG. 8 and FIG. 10 to FIG. 12 are layout views or cross-sectional views in a step of a manufacturing process of a display device according to an exemplary embodiment. FIG. 9 is a view showing an exposure amount of a partial portion in an exposure step among a manufacturing process of a display device according to an exemplary embodiment. FIG. 13 to FIG. 15 are top plan views showing a test resist pattern formed in a manufacturing process of a display device according to an exemplary embodiment. FIG. 16 to FIG. 20 are layout views or cross-sectional views showing a display device formed by a manufacturing process of a display device according to an exemplary embodiment.

Figure 5:
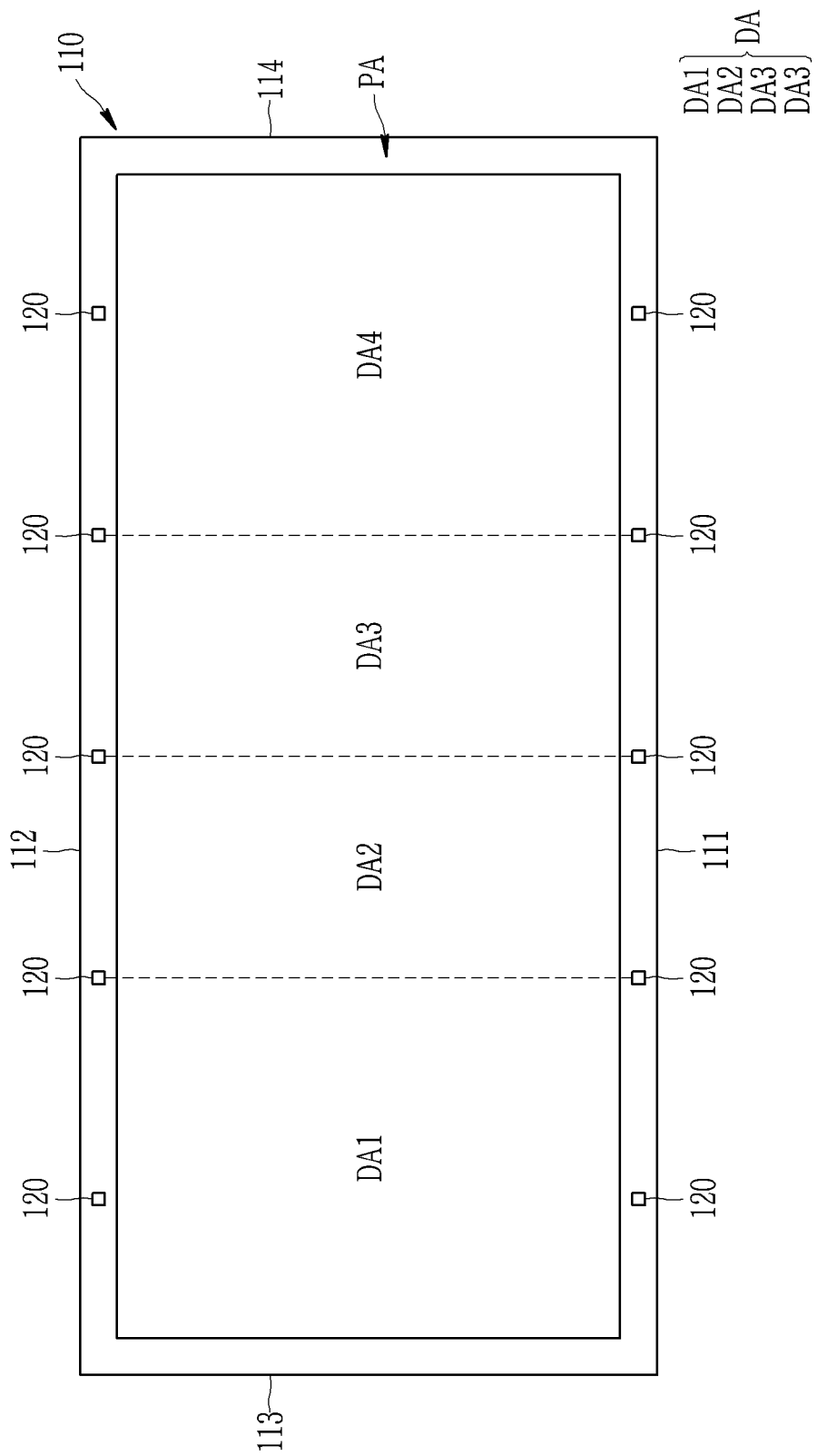
FIG. 5, FIG. 6, FIG. 7, FIG. 8, FIG. 10, FIG. 11, and FIG. 12 are layout views or cross-sectional views in a step of a manufacturing process of a display device according to an exemplary embodiment.

Referring to FIG. 5, a substrate 110 is prepared.

The substrate 110 may be made of a material including, but not limited to, transparent glass and plastic and may have a quadrangular shape. In the example shown in FIG., the substrate 110 has a substantially rectangular shape. In this case, the lengths of facing edges of both sides of the substrate 110 may be substantially the same. For example, the length of a first edge 111 of the substrate 110 may be substantially the same as the length of a second edge 112 that faces the first edge 111. In addition, the length of a third edge 113 connecting the first edge 111 and the second edge 112 may be substantially the same as the length of a fourth edge 114 that faces the third edge 113. The first edge 111 may correspond to the lower edge, the second edge 112 may correspond to the upper edge, the third edge 113 may correspond to the left edge, and the fourth edge 114 may correspond to the right edge.

The substrate 110 may include a display area DA and a peripheral area PA that surrounds the display area DA. The display area DA may be disposed at a center of the substrate 110, and may include a first display area DA1, a second display area DA2, a third display area DA3, and a fourth display area DA4. In the present exemplary embodiment, the display device may be manufactured through division exposure, and the first to fourth display areas DA1, DA2, DA3, and DA4 may correspond to the divided areas according to the progress of the division exposure. For example, if the display area DA is divided into four areas, four exposures may be performed. The first display area DA1, the second display area DA2, the third display area DA3, and the fourth display area DA4 may be sequentially disposed from left to right. Therefore, the second display area DA2 may be disposed between the first display area DA1 and the third display area DA3, and the third display area DA3 may be disposed between the second display area DA2 and the fourth display area DA4. The boundary between the first display area DA1 and the second display area DA2 may be parallel to the third edge 113 or the fourth edge 114. The boundary between the second display area DA2 and the third display area DA3 may be parallel to the third edge 113 or the fourth edge 114. The boundary between the third display area DA3 and the fourth display area DA4 may be parallel to the third edge 113 or the fourth edge 114. The peripheral area PA may be disposed along the first edge 111, the second edge 112, the third edge 113, and the fourth edge 114 of the substrate 110 and may surround the first display area DA1, the second display area DA2, the third display area DA3, and the fourth display area DA4.

A plurality of markers 120 may be disposed in the peripheral area PA of the substrate 110. The plurality of markers 120 may be disposed along the first edge 111 of the substrate 110. In addition, the plurality of markers 120 may be further disposed along the second edge 112 of the substrate 110. The plurality of markers 120 may be disposed on an extension line of the boundary between the first display area DA1 and the second display area DA2. In addition, the plurality of markers 120 may be further disposed on an extension line of the boundary between the second display area DA2 and the third display area DA3, and on an extension line of the boundary between the third display area DA3 and the fourth display area DA4.

The number of the plurality of markers 120 disposed along the first edge 111 of the substrate 110 may be more than the number of the division exposures by one. The number of the plurality of markers 120 disposed along the second edge 112 of the substrate 110 may be the same as the number of the plurality of markers 120 disposed along the first edge 111. That is, the number of the plurality of markers 120 disposed along the second edge 112 of the substrate 110 may be more than the number of the division exposures by one. For example, the display area DA of the substrate 110 is divided into four areas, and four division exposures may be performed. In this case, the number of the plurality of markers 120 disposed along the first edge 111 of the substrate 110 may be five, and the number of the plurality of markers 120 disposed along the second edge 112 of the substrate 110 may be five. The plurality of markers 120 disposed along the first edge 111 of the substrate 110 may be disposed to have a constant interval. The plurality of markers 120 disposed along the second edge 112 of the substrate 110 may be disposed to have a constant interval.

The plurality of markers 120 may have various shapes including, but not limited to, polygons, circles, and the like. The shapes of the plurality of markers 120 may be the same. However, the present exemplary embodiment is not limited thereto, and at least some of a plurality of markers 120 may have different shapes.

Figure 6:
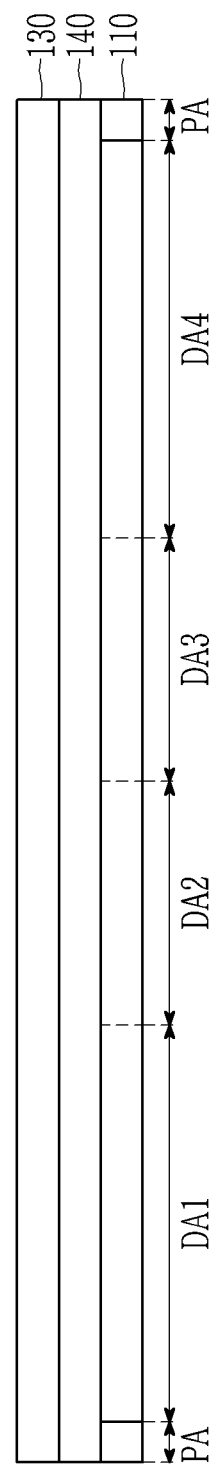

Referring to FIG. 6, a metal layer 140 is formed on the substrate 110. The metal layer 140 may include a single layer or multiple layers. The metal layer 140 may include a low resistance metal material. The metal layer 140 may be formed on the entire substrate 110. That is, the metal layer 140 may be formed to cover both the display area DA and the peripheral area PA of the substrate 110.

A photoresist 130 is formed on the metal layer 140. The photoresist 130 may include a polymer compound having photosensitivity. The photoresist 130 may be formed on the entire metal layer 140. That is, the photoresist 130 may be formed to cover both the display area DA and the peripheral area PA of the substrate 110.

Figure 7:
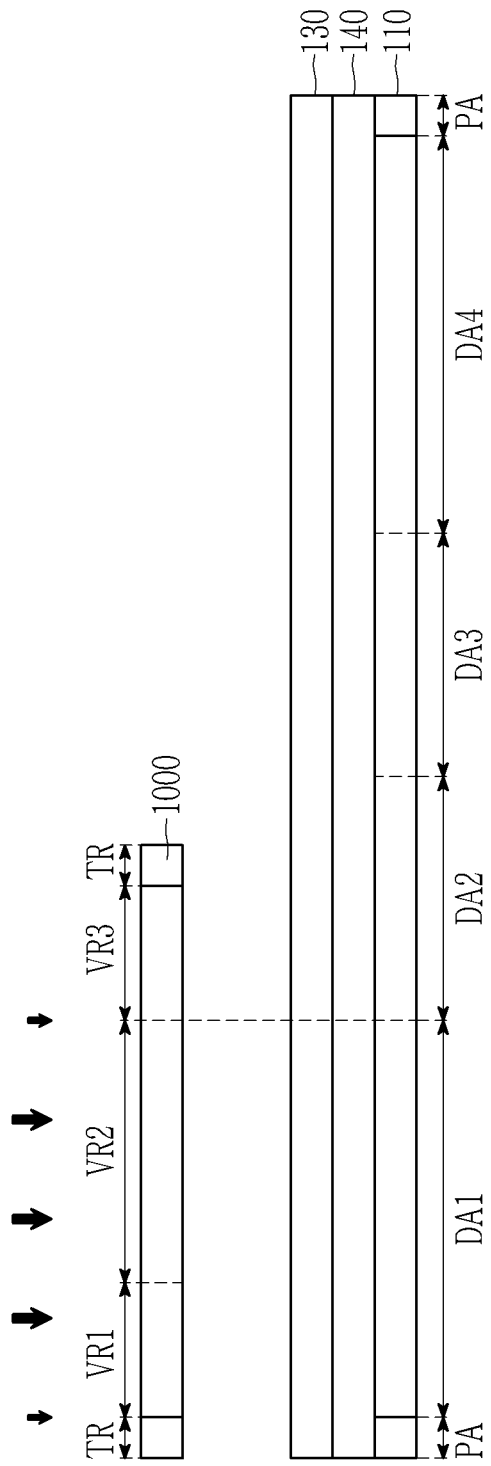

Referring to FIG. 7, a photomask 1000 is positioned on the substrate 110, and light is irradiated onto the photomask 1000.

The size of photomask 1000 is smaller than that of the substrate 110. The first region VR1 and the second region VR2 of the photomask 1000 are aligned to correspond to the first display area DA1 of the substrate 110. In this case, the third region VR3 of the photomask 1000 may correspond to the second display area DA2 of the substrate 110. Subsequent to the alignment, light is irradiated onto the first display area DA1 of the substrate 110 through the first region VR1 and the second region VR2 of the photomask 1000.

A predetermined pattern is formed on the photomask 1000. A portion of the light irradiated onto the photomask 1000 does not pass through the pattern and does not reach the substrate 110 while the remaining portion of the light irradiated onto the photomask 1000 may reach the substrate 110 through the portion of the photomask 1000 in which the predetermined pattern is not formed. In this case, the light passing through the photomask 1000 may cause a chemical change in the photoresist 130.

Figure 8:
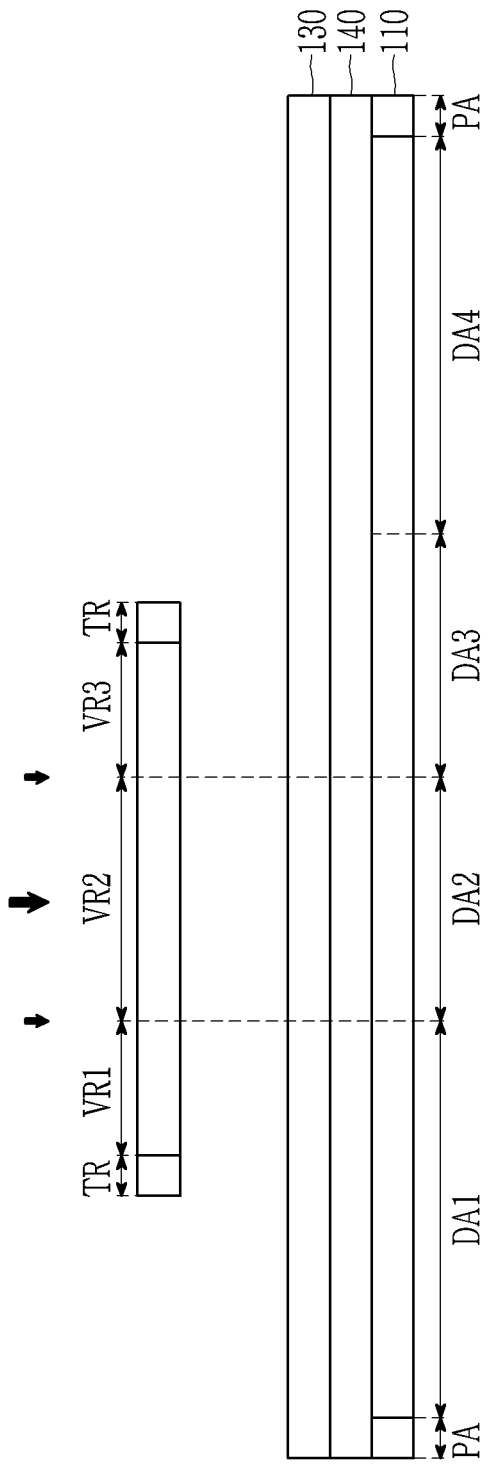
Figure 9:
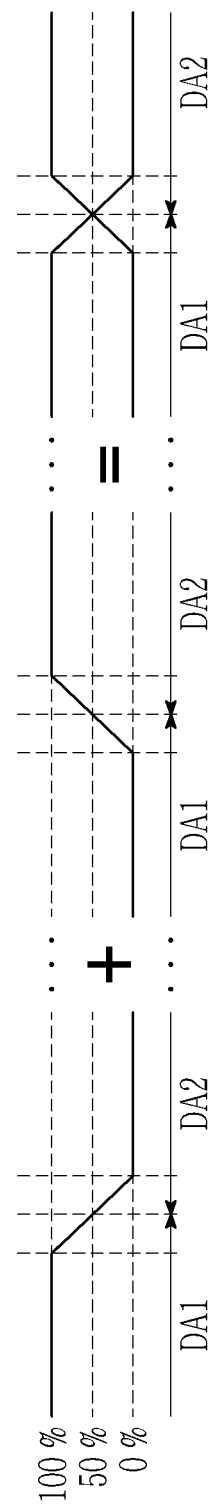
FIG. 9 is a view showing an exposure amount of a partial portion in an exposure step among a manufacturing process of a display device according to an exemplary embodiment.

Referring to FIG. 8, the photomask 1000 is shifted, and the light is irradiated onto the photomask 1000.

The second region VR2 of the photomask 1000 is aligned to correspond to the second display area DA2 of the substrate 110. In this case, the first region VR1 of the photomask 1000 corresponds to a portion of the first display area DA1 of the substrate 110 adjacent to the second display area DA2, and the third region VR3 of the photomask 1000 corresponds to a portion of the third display area DA3 of the substrate 110 adjacent to the second display area DA2. Subsequent to the alignment, light is irradiated onto the second display area DA2 of substrate 110 through the second region VR2 of the photomask 1000.

The boundary between the first display area DA1 and the second display area DA2 of the substrate 110 may be irradiated with the light in the first division exposure process of FIG. 7 and the second division exposure process of FIG. 8. Hereinafter, an amount of the light irradiated onto the boundary between the first display area DA1 and the second display area DA2 of the substrate 110 is described with reference to FIG. 9.

FIG. 9 is a view showing an exposure amount on the boundary between the first display area DA1 and the second display area DA2 of the substrate 110. FIG. 9 shows the first exposure amount for each area in the first division exposure, the second exposure amount for each area in the second division exposure, and the final exposure amount combining the first and second exposure amounts.

In the first division exposure process, about 100% of the light is irradiated onto most regions of the first display area DA1. In the vicinity of the boundary between the first display area DA1 and the second display area DA2, the amount of irradiated light gradually decreases from about 100% and reaches 0%. For example, about 50% of the light is irradiated onto the boundary between the first display area DA1 and the second display area DA2.

In the second division exposure process, about 100% of the light is irradiated onto most regions of the second display area DA2. In the vicinity of the boundary between the first display area DA1 and the second display area DA2, the amount of irradiated light gradually increases from about 0% and reaches about 100%. For example, about 50% of the light is irradiated onto the boundary between the first display area DA1 and the second display area DA2.

Combining the amount of the irradiated light in the first division exposure process and the second division exposure process, about 100% of the light is irradiated onto the boundary between the first display area DA1 and the second display area DA2. For example, on the boundary between the first display area DA1 and the second display area DA2, about 50% of the light is irradiated in the first division exposure and about 50% of the light is irradiated in the second division exposure, thereby about 100% of the light is irradiated as the sum thereof.

Figure 10:
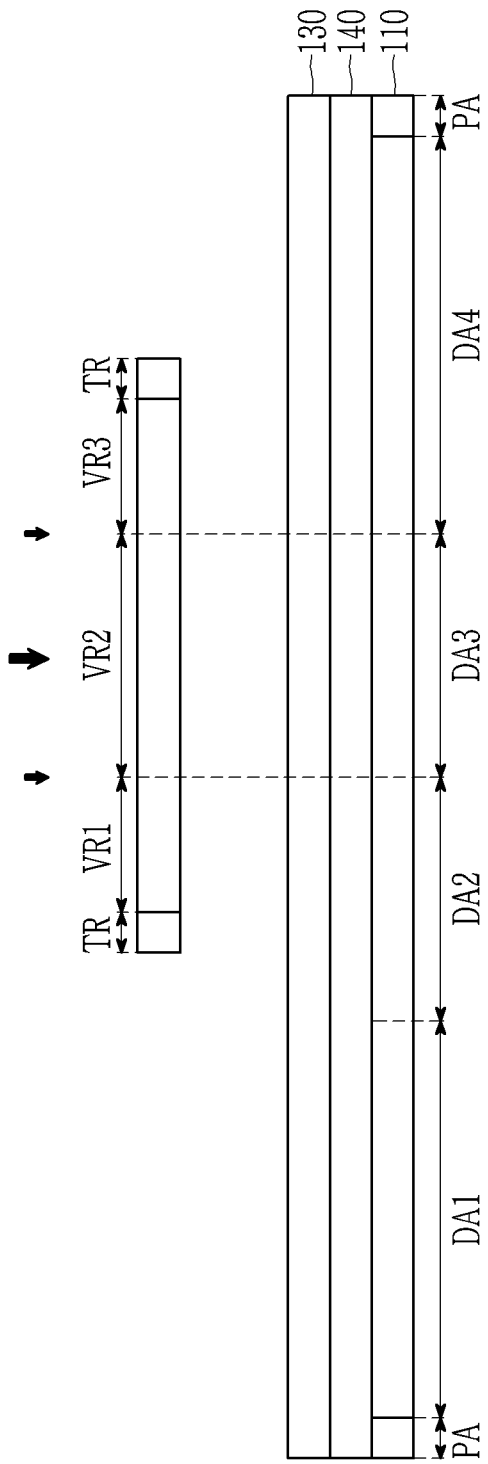

Referring to FIG. 10, the photomask 1000 is further shifted, and light is irradiated again onto the photomask 1000.

The second region VR2 of the photomask 1000 is aligned to correspond to the third display area DA3 of the substrate 110. In this case, the first region VR1 of the photomask 1000 corresponds to a portion of the second display area DA2 of the substrate 110 adjacent to the third display area DA3, and the third region VR3 of the photomask 1000 corresponds to a portion of the fourth display area DA4 of the substrate 110 adjacent to the third display area DA3. Subsequent to the alignment, light is irradiated onto the third display area DA3 of the substrate 110 through the second region VR2 of the photomask 1000.

The boundary between the second display area DA2 and the third display area DA3 of the substrate 110 may be irradiated with the light in the second division exposure process of FIG. 8 and the third division exposure process of FIG. 10. As described above, combining the amount of the irradiated light in the second division exposure process and the third division exposure process, about 100% of the light may be irradiated onto the boundary between the second display area DA2 and the third display area DA3 of the substrate 110.

Figure 11:
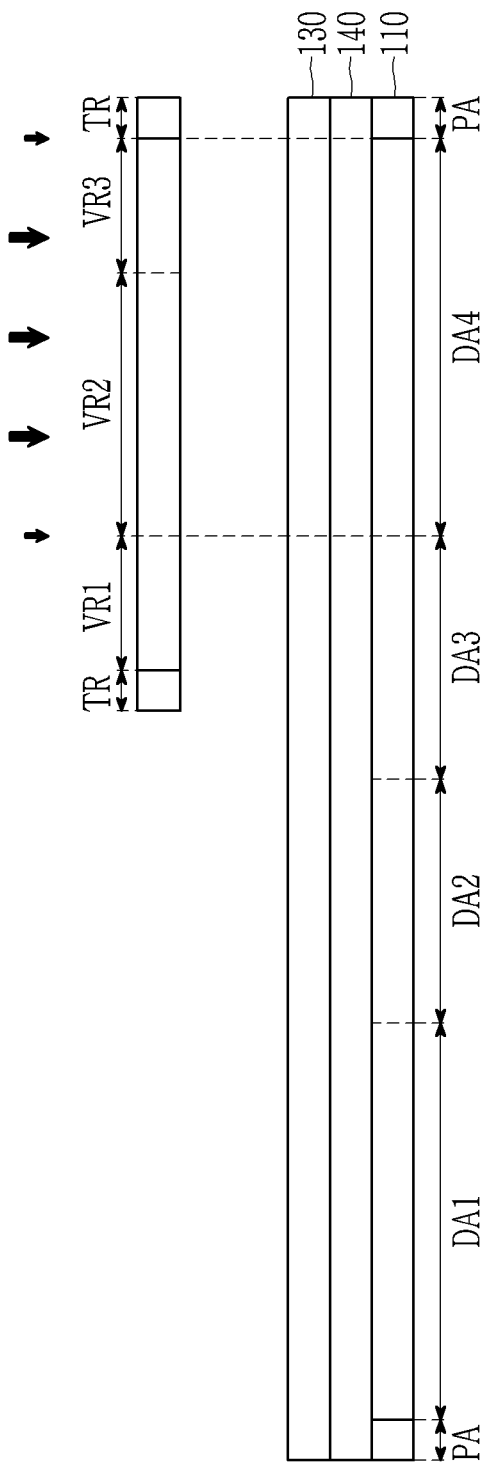

Referring to FIG. 11, the photomask 1000 is further shifted and light is irradiated again onto the photomask 1000.

The second region VR2 and the third region VR3 of the photomask 1000 are aligned to correspond to the fourth display area DA4 of the substrate 110. In this case, the first region VR1 of the photomask 1000 corresponds to a portion of the third display area DA3 of the substrate 110 adjacent to the fourth display area DA4. Subsequent to the alignment, light is irradiated onto the fourth display area DA4 of the substrate 110 through the second region VR2 and the third region VR3 of the photomask 1000.

The boundary between the third display area DA3 and the fourth display area DA4 of the substrate 110 may be irradiated with the light in the third division exposure process of FIG. 10 and the fourth division exposure process of FIG. 11. As described above, combining the amount of the irradiated light in the third division exposure process and the fourth division exposure process, about 100% of the light may be irradiated onto the boundary between the third display area DA3 and the fourth display area DA4 of the substrate 110.

By carrying out a development process including four division exposure processes, a test resist pattern 1300 may be formed on the substrate 110. FIG. 12 shows an example of the test resist pattern according to one embodiment.

In a case where the photoresist 130 is made of a positive type, the portion of the photoresist 130 irradiated with the light is removed, and the portion that is not irradiated with light remains. Although not shown, a plurality of resist patterns may be formed on the display area DA of the substrate 110.

The test resist pattern 1300 may be disposed in the peripheral area PA of the substrate 110. The test resist pattern 1300 may include a first test resist pattern 1310, a second test resist pattern 1320, and a third test resist pattern 1330. The first test resist pattern 1310, the second test resist pattern 1320, and the third test resist pattern 1330 may be disposed along the first edge 111 of the substrate 110. The test resist pattern 1300 may include a plurality of third test resist patterns 1330. For example, three third test resist patterns 1330 may be formed. The plurality of third test resist patterns 1330 may be disposed between the first test resist pattern 1310 and the second test resist pattern 1320. The plurality of third test resist patterns 1330 may be disposed on the extension line of the boundary between the first display area DA1 and the second display area DA2, on the extension line of the boundary between the second display area DA2 and the third display area DA3, and on the extension line of the boundary between the third display area DA3 and the fourth display area DA4. The first test resist pattern 1310 may be disposed adjacent to the first display area DA1. The second test resist pattern 1320 may be disposed adjacent to the fourth display area DA4.

The test resist pattern 1300 may be disposed to have a constant interval. The interval between the first test resist pattern 1310 and the third test resist pattern 1330 adjacent thereto may be substantially the same as the interval between a plurality of third test resist patterns 1330. In addition, the interval between the first test resist pattern 1310 and the third test resist pattern 1330 adjacent may be substantially the same as the interval between the second test resist pattern 1320 and the third test resist pattern 1330 adjacent thereto.

On a plane, a marker 120 of the substrate 110 may be disposed inside each test resist pattern 1300. Each marker 120 may be disposed at a center of each test resist pattern 1300.

The test resist pattern 1300 may further include a fourth test resist pattern 1340, a fifth test resist pattern 1350, and a sixth test resist pattern 1360. The fourth test resist pattern 1340, the fifth test resist pattern 1350, and the sixth test resist pattern 1360 may be disposed along the second edge 112 of the substrate 110. The test resist pattern 1300 may include a plurality of sixth test resist patterns 1360. For example, three sixth test resist patterns 1360 may be formed. The plurality of sixth test resist patterns 1360 may be disposed between the fourth test resist pattern 1340 and the fifth test resist pattern 1350. The plurality of sixth test resist patterns 1360 may be disposed on the extension line of the boundary between the first display area DA1 and the second display area DA2, on the extension line of the boundary between the second display area DA2 and the third display area DA3, and on the extension line of the boundary between the third display area DA3 and the fourth display area DA4. The fourth test resist pattern 1340 may be disposed adjacent to the first display area DA1. The fifth test resist pattern 1350 may be disposed adjacent to the fourth display area DA4.

In one embodiment, the first test resist pattern 1310, the second test resist pattern 1320, and the third test resist pattern 1330 may have different shapes. In another embodiment, the first test resist pattern 1310, the second test resist pattern 1320, and the third test resist pattern 1330 may have substantially the same shape with different sizes. If the first test resist pattern 1310 is shifted in a direction perpendicular to the boundary between the first display area DA1 and the second display area DA2, it may at least partially overlap the second test resist pattern 1320.

The fourth test resist pattern 1340 may have substantially the same shape and size as the first test resist pattern 1310. The fifth test resist pattern 1350 may have substantially the same shape and size as the second test resist pattern 1320. The sixth test resist pattern 1360 may have substantially the same shape and size as the third test resist pattern 1330.

However, the present exemplary embodiment is not limited thereto, and the fourth test resist pattern 1340 may have a shape and/or size different from the first test resist pattern 1310, and the fifth test resist pattern 1350 may have a shape and/size different from the second test resist pattern 1320. For example, the fourth test resist pattern 1340 may have substantially the same shape and/or size as the second test resist pattern 1320. In addition, the fifth test resist pattern 1350 may have substantially the same shape and/or size as the first test resist pattern 1310.

Hereinafter, various shapes of the first test resist pattern 1310, the second test resist pattern 1320, and the third test resist pattern 1330 are described with reference to FIG. 13 to FIG. 15.

FIG. 13 is a top plan view showing the first test resist pattern 1310, the second test resist pattern 1320, and the third test resist pattern 1330 along with markers 120 of the substrate 110.

As shown in FIG. 13, the first test resist pattern 1310 may have a ring shape. The marker 120 of the substrate 110 may be disposed inside the first test resist pattern 1310. The marker 120 may be disposed at a center of the first test resist pattern 1310. An outer shape 1312 and an inner shape 1314 of the first test resist pattern 1310 may have various shapes. For example, the outer shape 1312 and the inner shape 1314 of the first test resist pattern 1310 may have a quadrangle shape, respectively. For example, the first test resist pattern 1310 may have a square ring shape. In this case, the outer shape 1312 and the inner shape 1314 of the first test resist pattern 1310 may have a square shape, respectively. The outer shape 1312 of the first test resist pattern 1310 is larger than the inner shape 1314, so the length L1312 of one side of the outer shape 1312 of the first test resist pattern 1310 is longer than the length L1314 of one side of the inner shape 1314 of the first test resist pattern 1310.

The second test resist pattern 1320 may have a polygon shape. For example, the second test resist pattern 1320 may have a quadrangle shape. The marker 120 of the substrate 110 may be disposed inside the second test resist pattern 1320. The marker 120 may be disposed at a center of the second test resist pattern 1320. An outer shape 1322 of the second test resist pattern 1320 may be formed as a quadrangle shape, and the second test resist pattern 1320 may not have an inner shape. That is, the second test resist pattern 1320 may be formed with a quadrangle shape that is filled inside. In this case, the second test resist pattern 1320 may have a square shape.

The outer shape 1322 of the second test resist pattern 1320 may be larger than the inner shape 1314 of the first test resist pattern 1310 and may be smaller than the outer shape 1312 of the first test resist pattern 1310. Therefore, the length L1322 of one side of the outer shape 1322 of the second test resist pattern 1320 is longer than the length L1314 of one side of the inner shape 1314 of the first test resist pattern 1310 and may be shorter than the length L1312 of one of the outer shape 1312 of the first test resist pattern 1310.

The first test resist pattern 1310 may be shifted in a direction perpendicular to the boundary between the first display area DA1 and the second display area DA2 to at least partially overlap the second test resist pattern 1320. In this case, the outer shape 1322 of the second test resist pattern 1320 may be disposed inside the outer shape 1312 of the first test resist pattern 1310, and the inner shape 1314 of the first test resist pattern 1310 may be disposed inside the outer shape 1322 of the second test resist pattern 1320.

The third test resist pattern 1330 may have a ring shape. The marker 120 of the substrate 110 may be disposed inside the third test resist pattern 1330. The marker 120 may be disposed at a center of the third test resist pattern 1330. An outer shape 1332 and an inner shape 1334 of the third test resist pattern 1330 may have various shapes. For example, the outer shape 1332 and the inner shape 1334 of the third test resist pattern 1330 may have a quadrangle shape. For example, the third test resist pattern 1330 may have a square ring shape. In this case, the outer shape 1332 and the inner shape 1334 of the third test resist pattern 1330 may have a square shape, respectively. Since the outer shape 1332 of the third test resist pattern 1330 is larger than the inner shape 1334, the length L1332 of one side of the outer shape 1332 of the third test resist pattern 1330 is longer than the length L1334 of one side of the inner shape 1334 of the third test resist pattern 1330.

The first test resist pattern 1310 may be formed by the first test pattern 1210 (see FIG. 2) of the photomask 1000 and may have substantially the same shape and size as the first test pattern 1210. The second test resist pattern 1320 may be formed by the second test pattern 1220 (see FIG. 2) of the photomask 1000 and may have substantially the same shape size as the second test pattern 1220. The third test resist pattern 1330 may be formed by the first test pattern 1210 and the second test pattern 1220 of the photomask 1000. The third test resist pattern 1330 may be formed on a portion of the substrate 110 where a first portion and a second portion overlap, where the first portion corresponds to a portion where the light does not pass through the first test pattern 1210 in a division exposure process, and the second portion corresponds to a portion where the light does not pass through the second test pattern 1220 in a subsequent division exposure process. Portions of the photoresist 130 where approximately 50% of the light has passed in the division exposure process and approximately 50% of the light has passed in the subsequent division exposure process are removed to form the third test resist pattern 1330. The outer shape 1332 of the third test resist pattern 1330 is substantially the same as the outer shape 1322 of the second test resist pattern 1320. Therefore, the length L1332 of one side of the outer shape 1332 of the third test resist pattern 1330 is substantially the same as the length L1322 of one side of the outer shape 1322 of the second test resist pattern 1320. In addition, the inner shape 1334 of the third test resist pattern 1330 is substantially the same as the inner shape 1314 of the first test resist pattern 1310. Therefore, the length L1334 of one side of the inner shape 1334 of the third test resist pattern 1330 is substantially the same as the length L1314 of one side of the inner shape 1314 of the first test resist pattern 1310.

The shape of the first test resist pattern 1310, the second test resist pattern 1320, and the third test resist pattern 1330 according to an exemplary embodiment is not limited to the present example and may be variously changed without deviating from the scope of the present disclosure. Other shapes of the first test resist pattern 1310, the second test resist pattern 1320, and the third test resist pattern 1330 according to an exemplary embodiment are described with reference to FIG. 14 and FIG. 15.

FIG. 14 and FIG. 15 are top plan views showing an exemplary variation of the first test resist pattern 1310, the second test resist pattern 1320, and the third test resist pattern 1330 according to an exemplary embodiment.

Referring to FIG. 14, a first test resist pattern 2310 may have a ring shape. The marker 120 of the substrate 110 may be disposed inside the first test resist pattern 2310. The marker 120 may be disposed at a center of the first test resist pattern 2310. An outer shape 2312 and an inner shape 2314 of the first test resist pattern 2310 may have a quadrangle shape. For example, the first test resist pattern 2310 may have a square ring shape. In this case, the outer shape 2312 and the inner shape 2314 of the first test resist pattern 2310 may have a square shape, respectively. Since the outer shape 2312 of the first test resist pattern 2310 is larger than the inner shape 2314, the length L2312 of one side of the outer shape 2312 of the first test resist pattern 2310 is longer than the length L2314 of one side of the inner shape 2314 of the first test resist pattern 2310. A second test resist pattern 2320 may have a ring shape. The marker 120 of the substrate 110 may be disposed inside the second test resist pattern 2320. The marker 120 may be disposed at a center of the second test resist pattern 2320. An outer shape 2322 and an inner shape 2324 of the second test resist pattern 2320 may have a quadrangle shape. For example, the second test resist pattern 2320 may have a square ring shape. In this case, the outer shape 2322 and the inner shape 2324 of the second test resist pattern 2320 may have a square shape, respectively. Since the outer shape 2322 of the second test resist pattern 2320 is larger than the inner shape 2324, the length L2322 of one side of the outer shape 2322 of the second test resist pattern 2320 is longer than the length L2324 of one side of the inner shape 2324 of the second test resist pattern 2320.

The outer shape 2322 of the second test resist pattern 2320 may be larger than the inner shape 2314 of the first test resist pattern 2310 and may be smaller than the outer shape 2312 of the first test resist pattern 2310. Accordingly, the length L2322 of one side of the outer shape 2322 of the second test resist pattern 2320 may be longer than the length L2314 of one side of the inner shape 2314 of the first test resist pattern 2310 and may be shorter than the length L2312 of one side of the outer shape 2312 of the first test resist pattern 2310. The inner shape 2324 of the second test resist pattern 2320 may be smaller than the inner shape 2314 of the first test resist pattern 2310. Accordingly, the length L2324 of one side of the inner shape 2324 of the second test resist pattern 2320 may be shorter than the length L2314 of one side of the inner shape 2314 of the first test resist pattern 2310.

The first test resist pattern 2310 may be shifted in a direction perpendicular to the boundary between the first display area DA1 and the second display area DA2 to at least partially overlap the second test resist pattern 2320. In this case, the outer shape 2322 of the second test resist pattern 2320 may be disposed inside the outer shape 2312 of the first test resist pattern 2310, the inner shape 2314 of the first test resist pattern 2310 may be disposed inside the outer shape 2322 of the second test resist pattern 2320, and the inner shape 2324 of the second test resist pattern 2320 may be disposed inside the inner shape 2314 of the first test resist pattern 2310.

A third test resist pattern 2330 may have a ring shape. The marker 120 of the substrate 110 may be disposed inside the third test resist pattern 2330. The marker 120 may be disposed at a center of the third test resist pattern 2330. An outer shape 2332 and an inner shape 2334 of the third test resist pattern 2330 may have various shapes. For example, the outer shape 2332 and the inner shape 2334 of the third test resist pattern 2330 may have a quadrangle shape, respectively. For example, the third test resist pattern 2330 may have a square ring shape. In this case, the outer shape 2332 and the inner shape 2334 of the third test resist pattern 2330 may have a square shape, respectively. Since the outer shape 2332 of the third test resist pattern 2330 is larger than the inner shape 2334, the length L2332 of one side of the outer shape 2332 of the third test resist pattern 2330 is longer than the length L2334 of one side of the inner shape 2334 of the third test resist pattern 2330.

The first test resist pattern 2310 may be formed by the first test pattern 2210 (see FIG. 3) of the photomask 1000 and may have substantially the same shape and size of the first test pattern 2210. The second test resist pattern 2320 may be formed by the second test pattern 2220 (see FIG. 3) of the photomask 1000 and may have substantially the same shape and size of the second test pattern 2220. The third test resist pattern 2330 may be formed by the first test pattern 2210 and the second test pattern 2220 of the photomask 1000. The third test resist pattern 2330 may be formed on a portion of the substrate 110 where a first portion and a second portion overlap, where the first portion corresponds to a portion where the light does not pass through the first test pattern 2210 in a division exposure process, and a second portion corresponds to a portion where the light does not pass through the second test pattern 2220 in a subsequent division exposure process. Portions of the photoresist 130 where approximately 50% of the light has passed in the division exposure process and approximately 50% of the light has passed in the subsequent division exposure process are removed to form the third test resist pattern 2330. The outer shape 2332 of the third test resist pattern 2330 is substantially the same as the outer shape 2322 of the second test resist pattern 2320. Accordingly, the length L2332 of one side of the outer shape 2332 of the third test resist pattern 2330 is substantially the same as the length L2322 of one side of the outer shape 2322 of the second test resist pattern 2320. In addition, the inner shape 2334 of the third test resist pattern 2330 is substantially the same as the inner shape 2314 of the first test resist pattern 2310. Accordingly, the length L2334 of one side of the inner shape 2334 of the third test resist pattern 2330 is substantially the same as the length L2314 of one side of the inner shape 2314 of the first test resist pattern 2310.

Referring to FIG. 15, a first test resist pattern 3310 may have a ring shape. The marker 120 of the substrate 110 may be disposed inside the first test resist pattern 3310. The marker 120 may be disposed at a center of the first test resist pattern 3310. An outer shape 3312 and an inner shape 3314 of the first test resist pattern 3310 may have a circular shape. In this case, the first test resist pattern 3310 may have a circular ring shape. Since the outer shape 3312 of the first test resist pattern 3310 is larger than the inner shape 3314, the diameter L3312 of the outer shape 3312 of the first test resist pattern 3310 is larger than the diameter L3314 of the inner shape 3314 of the first test resist pattern 3310.

The second test resist pattern 3320 may have a ring shape. The marker 120 of the substrate 110 may be disposed inside the second test resist pattern 3320. The marker 120 may be disposed at a center of the second test resist pattern 3320. An outer shape 3322 and an inner shape 3324 of the second test resist pattern 3320 may have a circular shape. In this case, the second test resist pattern 3320 may have circular ring shape. Since the outer shape 3322 of the second test resist pattern 3320 is larger than the inner shape 3324, the diameter L3322 of the outer shape 3322 of the second test resist pattern 3320 is larger than the diameter L3324 of the inner shape 3324 of the second test resist pattern 3320.

The outer shape 3322 of the second test resist pattern 3320 may be larger than the inner shape 3314 of the first test resist pattern 3310 and may be smaller than the outer shape 3312 of the first test resist pattern 3310. Accordingly, the diameter L3322 of the outer shape 3322 of the second test resist pattern 3320 may be larger than the diameter L3314 of the inner shape 3314 of the first test resist pattern 3310 and may be smaller than the diameter L3312 of the outer shape 3312 of the first test resist pattern 3310. The inner shape 3324 of the second test resist pattern 3320 may be smaller than the inner shape 3314 of the first test resist pattern 3310. Accordingly, the diameter L3324 of the inner shape 3324 of the second test resist pattern 3320 may be smaller than the diameter L3314 of the inner shape 3314 of the first test resist pattern 3310.

The first test resist pattern 3310 may be shifted in a direction perpendicular to the boundary between the first display area DA1 and the second display area DA2 to at least partially overlap the second test resist pattern 3320. In this case, the outer shape 3322 of the second test resist pattern 3320 may be disposed inside the outer shape 3312 of the first test resist pattern 3310, the inner shape 3314 of the first test resist pattern 3310 may be disposed inside the outer shape 3322 of the second test resist pattern 3320, and the inner shape 3324 of the second test resist pattern 3320 may be disposed inside the inner shape 3314 of the first test resist pattern 3310.

A third test resist pattern 3330 may have a ring shape. The marker 120 of the substrate 110 may be disposed inside the third test resist pattern 3330. The marker 120 may be disposed at a center of the third test resist pattern 3330. An outer shape 3332 and an inner shape 3334 of the third test resist pattern 3330 may have a circular shape. In this case, the third test resist pattern 3330 may have a circular ring shape. Since the outer shape 3332 of the third test resist pattern 3330 is larger than the inner shape 3334, the diameter L3332 of the outer shape 3332 of the third test resist pattern 3330 is larger than the diameter L3334 of the inner shape 3334 of the third test resist pattern 3330.

The first test resist pattern 3310 may be formed by the first test pattern 3210 (see FIG. 5) of the photomask 1000 and have substantially the same shape and size as the first test pattern 3210. The second test resist pattern 3320 may be formed by the second test pattern 3220 (see FIG. 5) of the photomask 1000 and have substantially the same shape and size as the second test pattern 3220. The third test resist pattern 3330 may be formed by the first test pattern 3210 and the second test pattern 3220 of the photomask 1000. The third test resist pattern 3330 is formed on a portion of the substrate 110 where a first portion and a second portion overlap, where the first portion corresponds to a portion where the light does not pass through the first test pattern 3210 in a division exposure process, and a second portion corresponds to a portion where the light does not pass through the second test pattern 3220 in a subsequent division exposure process. Portions of the photoresist 130 where approximately 50% of the light has passed in the division exposure process and approximately 50% of the light has passed in the subsequent division exposure process are removed to form the third test resist pattern 3330. The outer shape 3332 of the third test resist pattern 3330 is substantially the same as the outer shape 3322 of the second test resist pattern 3320. Accordingly, the diameter L3332 of the outer shape 3332 of the third test resist pattern 3330 is substantially the same as the diameter L3322 of the outer shape 3322 of the second test resist pattern 3320. In addition, the inner shape 3334 of the third test resist pattern 3330 is substantially the same as the inner shape 3314 of the first test resist pattern 3310. Accordingly, the diameter L3334 of the inner shape 3334 of the third test resist pattern 3330 is substantially the same as the diameter L3314 of the inner shape 3314 of the first test resist pattern 3310.

According to one embodiment, an alignment error of the photomask 1000 may be determined based on the shape of the test resist pattern 1300. Referring to FIG. 13, if the marker 120 of the substrate 110 is not disposed at a center inside the first test resist pattern 1310, it may be determined that an alignment error has occurred between the substrate 110 and the photomask 1000 in the first division exposure process. In a case where the width of the left part and the width of the right part of the third test resist pattern 1330 that is disposed on the boundary between the first display area DA1 and the second display area DA2 are different, and/or in a case where the marker 120 of the substrate 110 is not disposed at a center, it may be determined that an alignment error has occurred between the substrate 110 and the photomask 1000 in the second division exposure process. In a case where the width of the left part and the width of the right part of the third test resist pattern 1330 disposed on the boundary between the second display area DA2 and the third display area DA3 are different, a case where the width of the upper part and the width of the lower part are different, and/or a case where the marker 120 of the substrate 110 is not disposed at a center, it may be determined that an alignment error has occurred between the substrate 110 and the photomask 1000 in the third division exposure process. In a case where the width of the left part and the width of the right part of the third test resist pattern 1330 disposed on the boundary between the third display area DA3 and the fourth display area DA4 are different, a case where the width of the upper part and the width of the lower part are different, and/or a case where the marker 120 of the substrate 110 is not disposed at a center, it may be determined that an alignment error has occurred between the substrate 110 and the photomask 1000 in the fourth division exposure process. In a case where the marker 120 of the substrate 110 is not disposed at a center inside the second test resist pattern 1320, it may be determined that an alignment error has occurred between the substrate 110 and the photomask 1000 in the fourth division exposure process. Absent of these alignment errors, it may be determined that no alignment error has occurred between the substrate 110 and the photomask 1000.

If it is determined that an alignment error of the photomask 1000 has occurred, the photoresist 130 may be entirely removed. Subsequently, the photoresist 130 may be formed again on the substrate 110, and an exposure and development processes may be repeated. Subsequently, if it is determined that no alignment error of the photomask 1000 has occurred, the next process may be performed.

Figure 16:
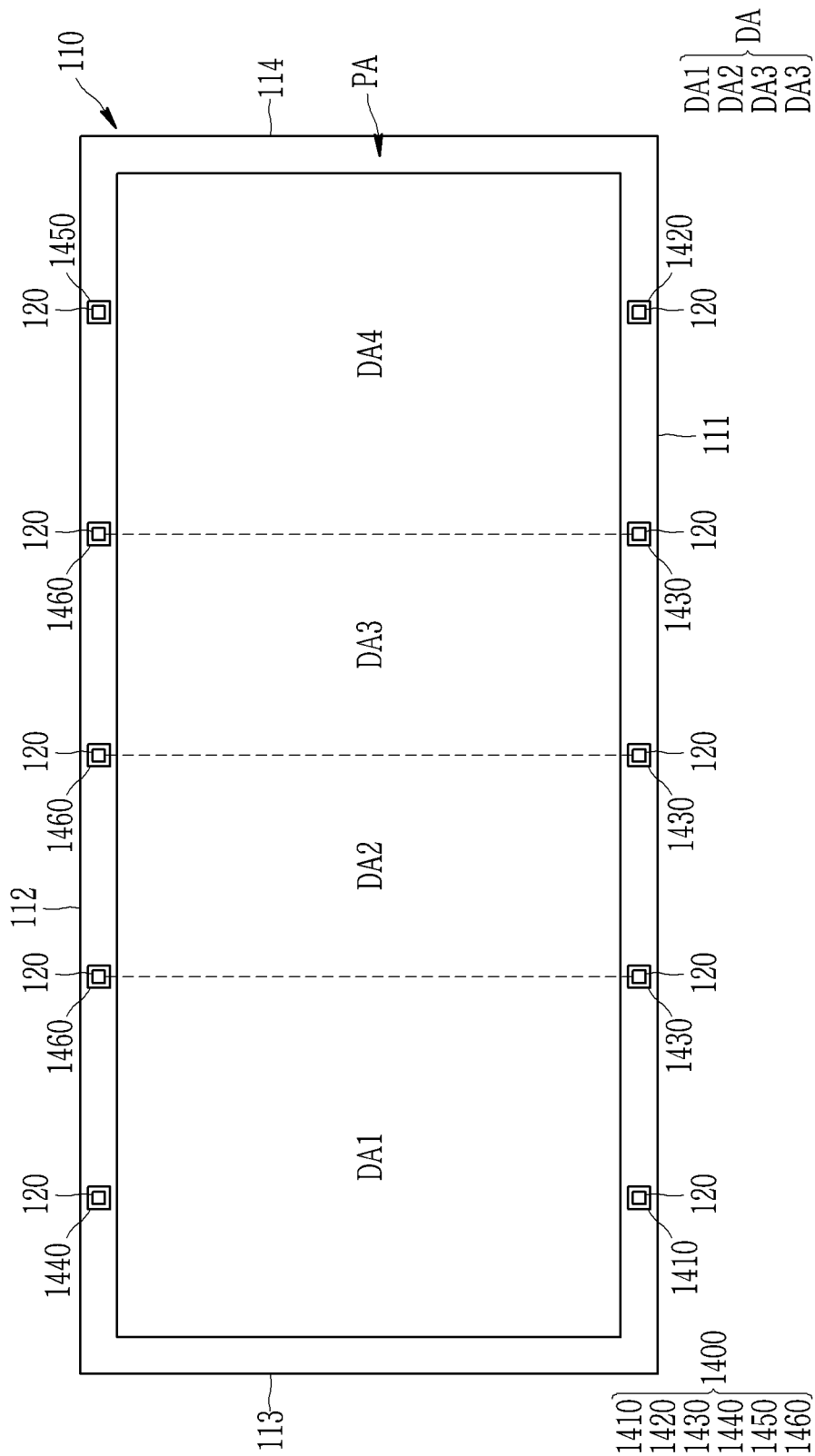
FIG. 16, FIG. 17, FIG. 18, FIG. 19, and FIG. 20 are layout views or cross-sectional views showing a display device formed by a manufacturing process of a display device according to an exemplary embodiment.

Subsequent processes may include, but are not limited to, etching the metal layer 140 using the developed photoresist 130 as a mask, and forming a test metal pattern 1400 as shown in FIG. 16.

The test metal pattern 1400 may have substantially the same shape as the developed photoresist 130. Although not shown, a plurality of metal patterns may be disposed on the display area DA of the substrate 110. The photoresist 130 may be entirely removed after forming the metal patterns.

The test metal pattern 1400 may be disposed in the peripheral area PA of the substrate 110. The test metal pattern 1400 may include a first test metal pattern 1410, a second test metal pattern 1420, and a third test metal pattern 1430. The first test metal pattern 1410, the second test metal pattern 1420, and the third test metal pattern 1430 may be disposed along the first edge 111 of the substrate 110. The test metal pattern 1400 may include a plurality of third test metal patterns 1430. For example, three third test metal patterns 1430 may be formed. The plurality of third test metal patterns 1430 may be disposed between the first test metal pattern 1410 and the second test metal pattern 1420. The plurality of third test metal patterns 1430 may be disposed on the extension line of the boundary between the first display area DA1 and the second display area DA2, on the extension line of the boundary between the second display area DA2 and the third display area DA3, and on the extension line of the boundary between the third display area DA3 and the fourth display area DA4. The first test metal pattern 1410 may be disposed adjacent to the first display area DA1. The second test metal pattern 1420 may be disposed adjacent to the fourth display area DA4.

The test metal patterns 1400 may be disposed to have a constant interval. The interval between the first test metal pattern 1410 and the third test metal pattern 1430 adjacent thereto may be substantially the same as the interval between the plurality of third test metal patterns 1430. In addition, the interval between the first test metal pattern 1410 and the third test metal pattern 1430 adjacent thereto may be substantially the same as the interval between the second test metal pattern 1420 and the third test metal pattern 1430 adjacent thereto.

On a plane, a marker 120 of the substrate 110 may be disposed inside each test metal pattern 1400. Each marker 120 may be disposed at a center of each test metal pattern 1400.

The test metal pattern 1400 may further include a fourth test metal pattern 1440, a fifth test metal pattern 1450, and a sixth test metal pattern 1460. The fourth test metal pattern 1440, the fifth test metal pattern 1450, and the sixth test metal pattern 1460 may be disposed along the second edge 112 of the substrate 110. The test metal pattern 1400 may include a plurality of sixth test metal patterns 1460. For example, three sixth test metal patterns 1460 may be formed. The plurality of sixth test metal patterns 1460 may be disposed between the fourth test metal pattern 1440 and the fifth test metal pattern 1450. The plurality of sixth test metal patterns 1460 may be disposed on the extension line of the boundary between the first display area DA1 and the second display area DA2, on the extension line of the boundary between the second display area DA2 and the third display area DA3, and on the extension line of the boundary between the third display area DA3 and the fourth display area DA4. The fourth test metal pattern 1440 may be disposed adjacent to the first display area DA1. The fifth test metal pattern 1450 may be disposed adjacent to the fourth display area DA4.

According to one embodiment, the first test metal pattern 1410, the second test metal pattern 1420, and the third test metal pattern 1430 may have different shapes. In another embodiment, the first test metal pattern 1410, the second test metal pattern 1420, and the third test metal pattern 1430 may have substantially the same shape with different sizes. If the first test metal pattern 1410 is shifted in a direction perpendicular to the boundary between the first display area DA1 and the second display area DA2, it may partially overlap the second test metal pattern 1420.

The fourth test metal pattern 1440 may have substantially the same shape and size as the first test metal pattern 1410. The fifth test metal pattern 1450 may have substantially the same shape and size as the second test metal pattern 1420. The sixth test metal pattern 1460 may have substantially the same shape and size as the third test metal pattern 1430.

However, the present exemplary embodiment is not limited thereto, and the fourth test metal pattern 1440 may have a shape and/or size different from the first test metal pattern 1410, and the fifth test metal pattern 1450 may have a shape and/or size different from the second test metal pattern 1420. For example, the fourth test metal pattern 1440 may have substantially the same shape and size as the second test metal pattern 1420. In addition, the fifth test metal pattern 1450 may have substantially the same shape and size as the first test metal pattern 1410.

Hereinafter, various shapes of the first test metal pattern 1410, the second test metal pattern 1420, and the third test metal pattern 1430 are described with reference to FIG. 17 to FIG. 19.

Figure 17:
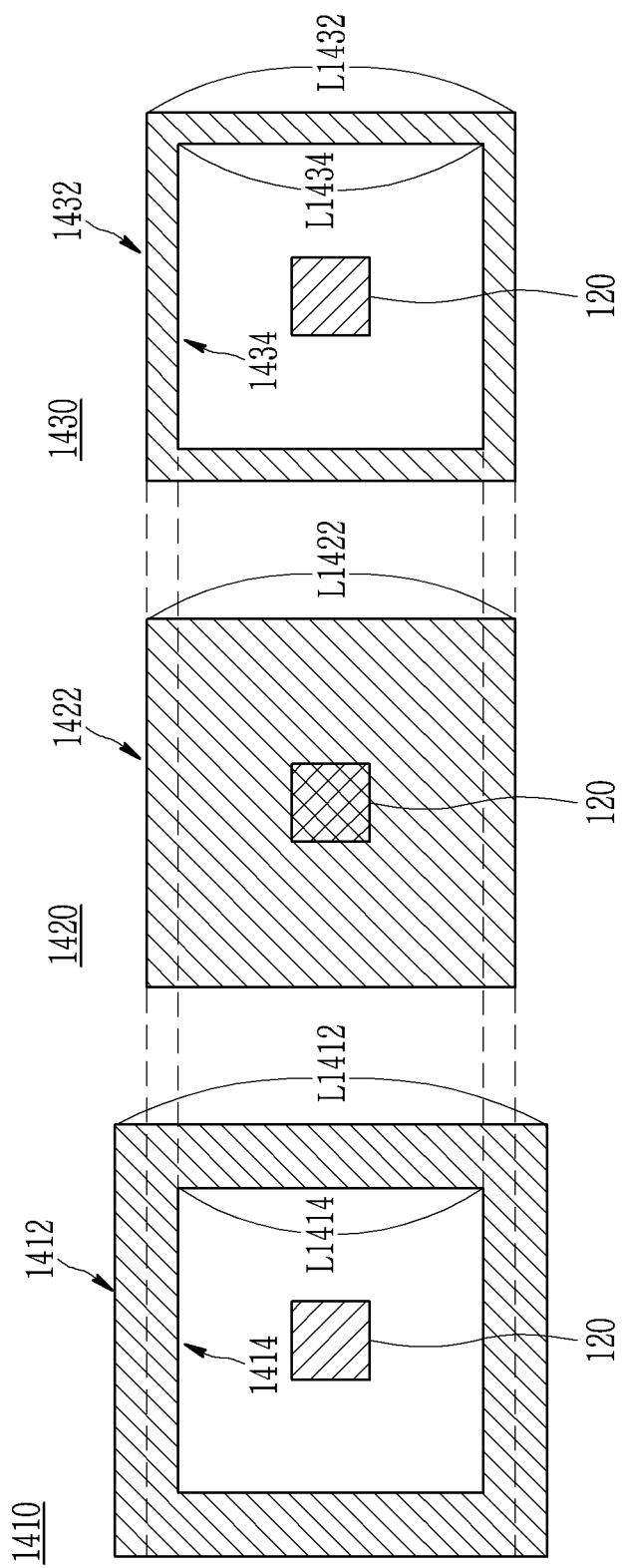

FIG. 17 is a top plan view showing the first test metal pattern 1410, the second test metal pattern 1420, and the third test metal pattern 1430 along with markers 120 of the substrate 110.

As shown in FIG. 17, the first test metal pattern 1410 may have a ring shape. The marker 120 of the substrate 110 may be disposed inside the first test metal pattern 1410. The marker 120 may be disposed at a center of the first test metal pattern 1410. An outer shape 1412 and an inner shape 1414 of the first test metal pattern 1410 may have various shapes. For example, the outer shape 1412 and the inner shape 1414 of the first test metal pattern 1410 may have a quadrangle shape, respectively. For example, the first test metal pattern 1410 may have a square ring shape. In this case, the outer shape 1412 and the inner shape 1414 of the first test metal pattern 1410 may have a square shape, respectively. Since the outer shape 1412 of the first test metal pattern 1410 is larger than the inner shape 1414, the length L1412 of one side of the outer shape 1412 of the first test metal pattern 1410 is longer than the length L1414 of one side of the inner shape 1414 of the first test metal pattern 1410.

The second test metal pattern 1420 may have a polygon shape. For example, the second test metal pattern 1420 may have a quadrangle shape. The marker 120 of the substrate 110 may be disposed inside the second test metal pattern 1420. The marker 120 may be disposed at a center of the second test metal pattern 1420. An outer shape 1422 of the second test metal pattern 1420 may have a quadrangle shape, and the inner shape may not be provided. That is, the second test metal pattern 1420 may have a quadrangle shape that is filled inside. In this case, the second test metal pattern 1420 may have a square shape.

The outer shape 1322 of the second test metal pattern 1420 may be larger than the inner shape 1414 of the first test metal pattern 1410 and may be smaller than the outer shape 1412 of the first test metal pattern 1410. Accordingly, the length L1422 of one side of the outer shape 1422 of the second test metal pattern 1420 may be longer than the length L1414 of one side of the inner shape 1414 of the first test metal pattern 1410 and may be shorter than the length L1412 of one side of the outer shape 1412 of the first test metal pattern 1410.

The first test metal pattern 1410 may be shifted in a direction perpendicular to the boundary between the first display area DA1 and the second display area DA2 to at least partially overlap the second test metal pattern 1420. In this case, the outer shape 1422 of the second test metal pattern 1420 may be disposed inside the outer shape 1412 of the first test metal pattern 1410, and the inner shape 1414 of the first test metal pattern 1410 may be disposed inside the outer shape 1422 of the second test metal pattern 1420.

The third test metal pattern 1430 may have a ring shape. The marker 120 of the substrate 110 may be disposed inside the third test metal pattern 1430. The marker 120 may be disposed at a center of the third test metal pattern 1430. An outer shape 1432 and an inner shape 1434 of the third test metal pattern 1430 may have various shapes. For example, the outer shape 1432 and the inner shape 1434 of the third test metal pattern 1430 may have a quadrangle shape. For example, the third test metal pattern 1430 may have a square ring shape. In this case, the outer shape 1432 and the inner shape 1434 of the third test metal pattern 1430 may have a square shape, respectively. Since the outer shape 1432 of the third test metal pattern 1430 is larger than the inner shape 1434, the length L1432 of one side of the outer shape 1432 of the third test metal pattern 1430 is longer than the length L1434 of one side of the inner shape 1434 of the third test metal pattern 1430.

The first test metal pattern 1410 may be formed by performing an etching process using the first test resist pattern 1310 as a mask, and may have substantially the same shape and size as the first test resist pattern 1310. The second test metal pattern 1420 may be formed by performing an etching process using the second test resist pattern 1320 as a mask, and may have substantially the same shape and size as the second test resist pattern 1320. The third test metal pattern 1430 may be formed by performing an etching process using the third test resist pattern 1330 as a mask, and may have substantially the same shape and size as the third test resist pattern 1330. The outer shape 1432 of the third test metal pattern 1430 is substantially the same as the outer shape 1422 of the second test metal pattern 1420. Accordingly, the length L1432 of one side of the outer shape 1432 of the third test metal pattern 1430 is substantially the same as the length L1422 of one side of the outer shape 1422 of the second test metal pattern 1420. In addition, the inner shape 1434 of the third test metal pattern 1430 is substantially the same as the inner shape 1414 of the first test metal pattern 1410. Accordingly, the length L1434 of one side of the inner shape 1434 of the third test metal pattern 1430 is substantially the same as the length L1414 of one side of the inner shape 1414 of the first test metal pattern 1410.

The shapes of the first test metal pattern 1410, the second test metal pattern 1420, and the third test metal pattern 1430 according to an exemplary embodiment are not limited to the present example, and may be variously changed without deviating from the scope of the present disclosure. Other shapes of the first test metal pattern 1410, the second test metal pattern 1420, and the third test metal pattern 1430 according to an exemplary embodiment are described with reference to FIG. 18 and FIG. 19.

Figure 18:
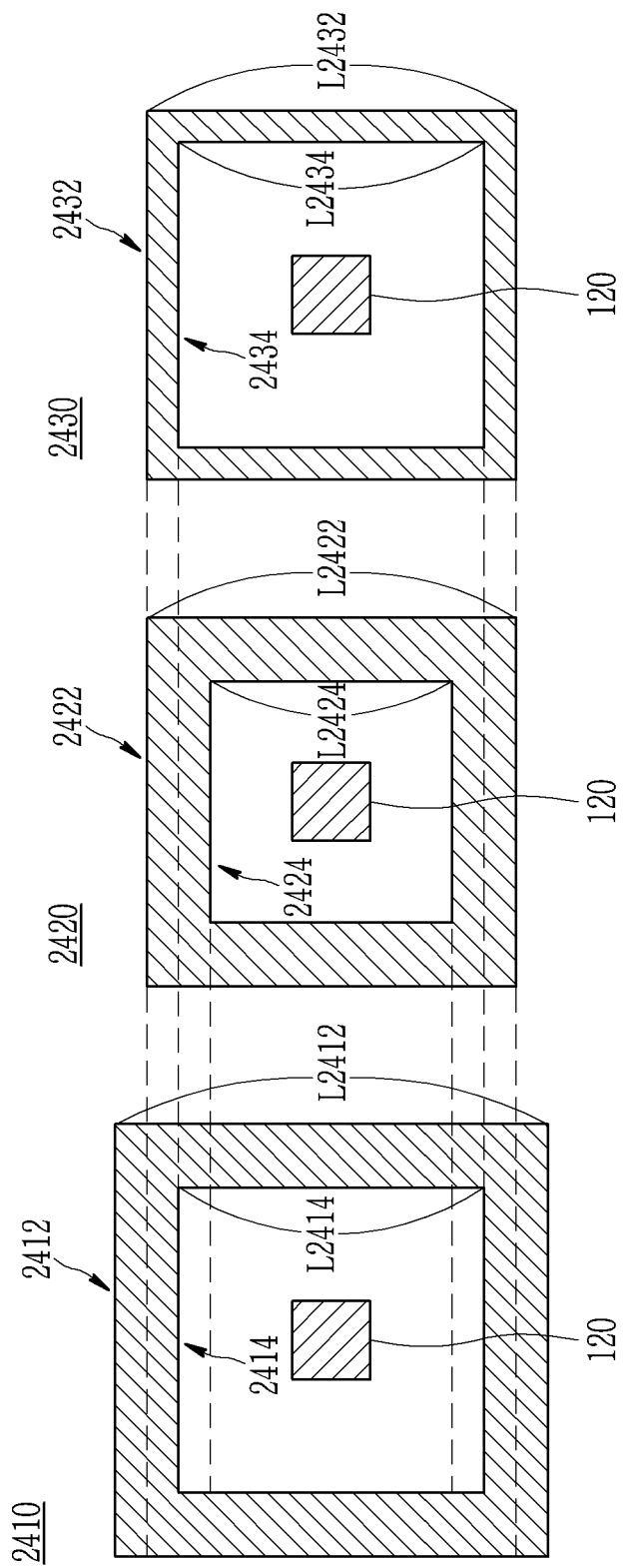
Figure 19:
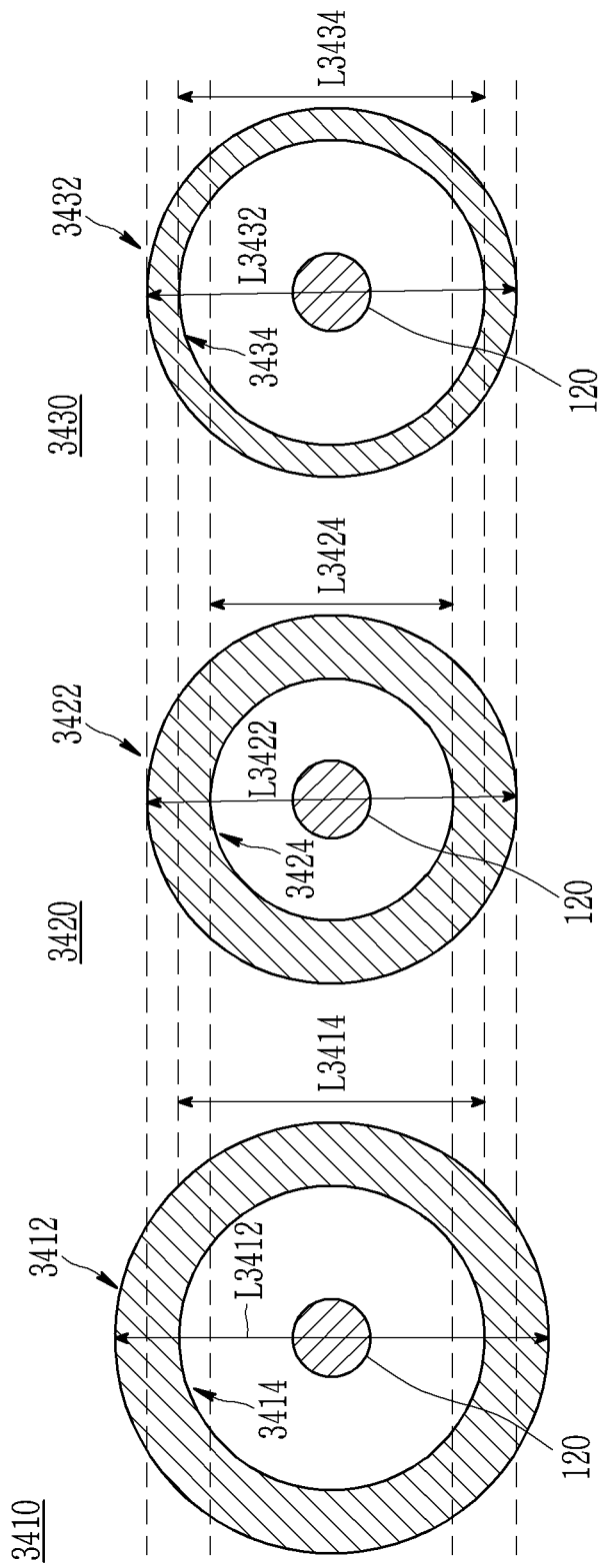

FIG. 18 and FIG. 19 are top plan views showing an exemplary variation of the first test metal pattern 1410, the second test metal pattern 1420, and the third test metal pattern 1430 according to an exemplary embodiment.

Referring to FIG. 18, a first test metal pattern 2410 may have a ring shape. The marker 120 of the substrate 110 may be disposed inside the first test metal pattern 2410. The marker 120 may be disposed at a center of the first test metal pattern 2410. An outer shape 2412 and an inner shape 2414 of the first test metal pattern 2410 may have a quadrangle shape. For example, the first test metal pattern 2410 may have a square ring shape. In this case, the outer shape 2412 and the inner shape 2414 of the first test metal pattern 2410 may have a square shape, respectively. Since the outer shape 2412 of the first test metal pattern 2410 is larger than the inner shape 2414, the length L2412 of one side of the outer shape 2412 of the first test metal pattern 2410 is longer than the length L2414 of one side of the inner shape 2414 of the first test metal pattern 2410.

A second test metal pattern 2420 may have a ring shape. The marker 120 of the substrate 110 may be disposed inside the second test metal pattern 2420. The marker 120 may be disposed at a center of the second test metal pattern 2420. An outer shape 2422 and an inner shape 2424 of the second test metal pattern 2420 may have a quadrangle shape. For example, the second test metal pattern 2420 may have a square ring shape. In this case, the outer shape 2422 and the inner shape 2424 of the second test metal pattern 2420 may have a square shape, respectively. Since the outer shape 2422 of the second test metal pattern 2420 is larger than the inner shape 2424, the length L2422 of one side of the outer shape 2422 of the second test metal pattern 2420 is longer than the length L2424 of one side of the inner shape 2424 of the second test metal pattern 2420.

The outer shape 2422 of the second test metal pattern 2420 may be larger than the inner shape 2414 of the first test metal pattern 2410 and may be smaller than the outer shape 2412 of the first test metal pattern 2410. Accordingly, the length L2422 of one side of the outer shape 2422 of the second test metal pattern 2420 may be longer than the length L2414 of one side of the inner shape 2414 of the first test metal pattern 2410 and may be shorter than the length L2412 of one side of the outer shape 2412 of the first test metal pattern 2410. The inner shape 2424 of the second test metal pattern 2420 may be smaller than the inner shape 2414 of the first test metal pattern 2410. Accordingly, the length L2424 of one side of the inner shape 2424 of the second test metal pattern 2420 may be shorter than the length L2414 of one side of the inner shape 2414 of the first test metal pattern 2410.

The first test metal pattern 2410 may be shifted in a direction perpendicular to the boundary between the first display area DA1 and the second display area DA2 to at least partially overlap the second test metal pattern 2420. In this case, the outer shape 2422 of the second test metal pattern 2420 may be disposed inside the outer shape 2412 of the first test metal pattern 2410, the inner shape 2414 of the first test metal pattern 2410 may be disposed inside the outer shape 2422 of the second test metal pattern 2420, and the inner shape 2424 of the second test metal pattern 2420 may be disposed inside the inner shape 2414 of the first test metal pattern 2410.

A third test metal pattern 2430 may have a ring shape. The marker 120 of the substrate 110 may be disposed inside the third test metal pattern 2430. The marker 120 may be disposed at a center of the third test metal pattern 2430. An outer shape 2432 and an inner shape 2434 of the third test metal pattern 2430 may have various shapes. For example, the outer shape 2432 and the inner shape 2434 of the third test metal pattern 2430 may have a quadrangle shape, respectively. For example, the third test metal pattern 2430 may have a square ring shape. In this case, the outer shape 2432 and the inner shape 2434 of the third test metal pattern 2430 may have a square shape, respectively. Since the outer shape 2432 of the third test metal pattern 2430 is larger than the inner shape 2434, the length L2432 of one side of the outer shape 2432 of the third test metal pattern 2430 is longer than the length L2434 of one side of the inner shape 2434 of the third test metal pattern 2430.

The first test metal pattern 2410 may be formed by performing an etching process using the first test resist pattern 2310 as a mask, and may have substantially the same shape and size as the first test resist pattern 2310. The second test metal pattern 2420 may be formed by performing an etching process using the second test resist pattern 2320 as a mask, and may have substantially the same shape and size as the second test resist pattern 2320. The third test metal pattern 2430 may be formed by performing an etching process using the third test resist pattern 2330 as a mask, and may have substantially the same shape and size as the third test resist pattern 2330. The outer shape 2432 of the third test metal pattern 2430 is substantially the same as the outer shape 2422 of the second test metal pattern 2420. Accordingly, the length L2432 of one side of the outer shape 2432 of the third test metal pattern 2430 is substantially the same as the length L2422 of one side of the outer shape 2422 of the second test metal pattern 2420. In addition, the inner shape 2434 of the third test metal pattern 2430 is substantially the same as the inner shape 2414 of the first test metal pattern 2410. Accordingly, the length L2434 of one side of the inner shape 2434 of the third test metal pattern 2430 is substantially the same as the length L2414 of one side of the inner shape 2414 of the first test metal pattern 2410.

Referring to FIG. 19, a first test metal pattern 3410 may have a ring shape. The marker 120 of the substrate 110 may be disposed inside the first test metal pattern 3410. The marker 120 may be disposed at a center of the first test metal pattern 3410. An outer shape 3412 and an inner shape 3414 of first test metal pattern 3410 may have a circular shape. In this case, the first test metal pattern 3410 may have a circular ring shape. Since the outer shape 3412 of the first test metal pattern 3410 is larger than the inner shape 3414, the diameter L3412 of the outer shape 3412 of the first test metal pattern 3410 is larger than the diameter L3414 of the inner shape 3414 of the first test metal pattern 3410.

A second test metal pattern 3420 may have a ring shape. The marker 120 of the substrate 110 may be disposed inside the second test metal pattern 3420. The marker 120 may be disposed at a center of the second test metal pattern 3420. An outer shape 3422 and an inner shape 3424 of the second test metal pattern 3420 may have a circular shape. in this case, the second test metal pattern 3420 may have a circular ring shape. The outer shape 3422 of the second test metal pattern 3420 is larger than the inner shape 3424, so the diameter L3422 of the outer shape 3422 of the second test metal pattern 3420 is larger than the diameter L3424 of the inner shape 3424 of the second test metal pattern 3420.

The outer shape 3422 of the second test metal pattern 3420 may be larger than the inner shape 3414 of the first test metal pattern 3410 and may be smaller than the outer shape 3412 of the first test metal pattern 3410. Therefore, the diameter L3422 of the outer shape 3422 of the second test metal pattern 3420 may be larger than the diameter L3414 of the inner shape 3414 of the first test metal pattern 3410 and may be smaller than the diameter L3412 of the outer shape 3412 of the first test metal pattern 3410. The inner shape 3424 of the second test metal pattern 3420 may be smaller than the inner shape 3414 of the first test metal pattern 3410. Therefore, the diameter L3424 of the inner shape 3424 of the second test metal pattern 3420 may be smaller than the diameter L3414 of the inner shape 3414 of the first test metal pattern 3410.

The first test metal pattern 3410 may be shifted in a direction perpendicular to the boundary between the first display area DA1 and the second display area DA2 to at least partially overlap the second test metal pattern 3420. In this case, the outer shape 3422 of the second test metal pattern 3420 may be disposed inside the outer shape 3412 of the first test metal pattern 3410, the inner shape 3414 of the first test metal pattern 3410 may be disposed inside the outer shape 3422 of the second test metal pattern 3420, and the inner shape 3424 of the second test metal pattern 3420 may be disposed inside the inner shape 3414 of the first test metal pattern 3410.

A third test metal pattern 3430 may have a ring shape. The marker 120 of the substrate 110 may be disposed inside the third test metal pattern 3430. The marker 120 may be disposed at a center of the third test metal pattern 3430. An outer shape 3432 and an inner shape 3434 of the third test metal pattern 3430 may have a circular shape. In this case, the third test metal pattern 3430 may have a circular ring shape. The outer shape 3432 of the third test metal pattern 3430 is larger than the inner shape 3434, so the diameter L3432 of the outer shape 3432 of the third test metal pattern 3430 is larger than the diameter L3434 of the inner shape 3434 of the third test metal pattern 3430.

The first test metal pattern 3410 may be formed by performing an etching process using the first test resist pattern 3310 as a mask, and may have substantially the same shape and size as the first test resist pattern 3310. The second test metal pattern 3420 may be formed by performing an etching process using the second test resist pattern 3320 as a mask, and may have substantially the same shape and size as the second test resist pattern 3320. The third test metal pattern 3430 may be formed by performing an etching process using the third test resist pattern 3330 as a mask, and may have substantially the same shape and size as the third test resist pattern 3330. The outer shape 3432 of the third test metal pattern 3430 is substantially the same as the outer shape 3422 of the second test metal pattern 3420. Therefore, the diameter L3432 of the outer shape 3432 of the third test metal pattern 3430 is substantially the same as the diameter L3422 of the outer shape 3422 of the second test metal pattern 3420. In addition, the inner shape 3434 of the third test metal pattern 3430 is substantially the same as the inner shape 3414 of the first test metal pattern 3410. Therefore, the diameter L3434 of the inner shape 3434 of the third test metal pattern 3430 is substantially the same as the diameter L3414 of the inner shape 3414 of the first test metal pattern 3410.

Hereinafter, a cross-section shape of a display device according to an exemplary embodiment including the test metal pattern 1400 is described with reference to FIG. 20.

Figure 20:
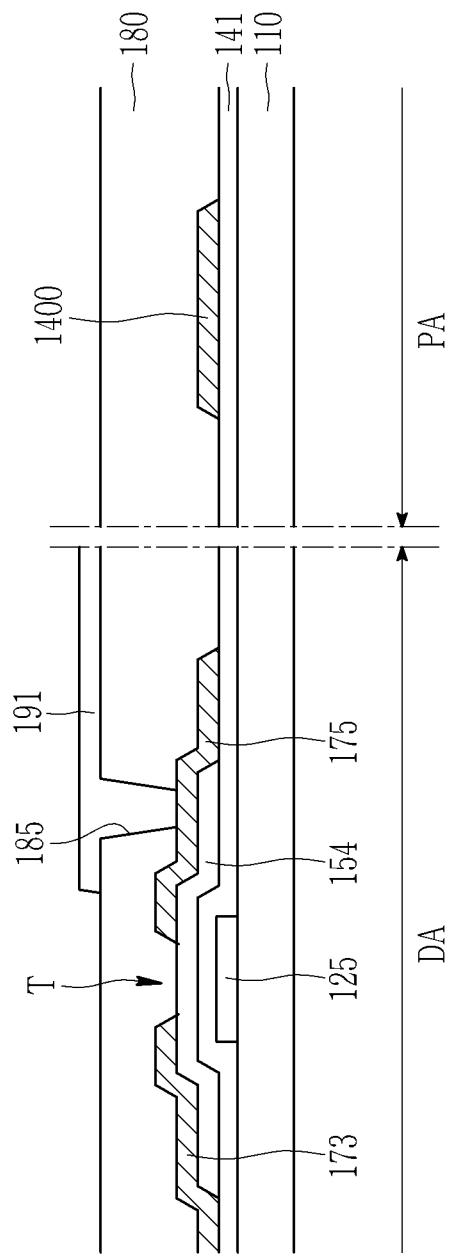

FIG. 20 is a cross-sectional view showing a display device according to an exemplary embodiment. FIG. 20 shows display area DA and the peripheral area PA according to an exemplary embodiment.

As shown in FIG. 20, the display device includes a substrate 110, a thin film transistor T disposed on the substrate 110, and a pixel electrode 191 connected to the thin film transistor T. A plurality of pixels may be disposed in the display area DA, and each pixel may include at least one thin film transistor T and at least one pixel electrode 191.

The thin film transistor T may include a gate electrode 125 disposed on the substrate 110, a semiconductor 154 overlapping the gate electrode 125, and a source electrode 173 and a drain electrode 175 separated from each other on the semiconductor 154. A gate insulating layer 141 may be disposed between the gate electrode 125 and the semiconductor 154.

A passivation layer 180 may be disposed on the source electrode 173 and the drain electrode 175. The passivation layer 180 may include an opening 185 overlapping at least a portion of the drain electrode 175. The pixel electrode 191 may be disposed on the passivation layer 180. The pixel electrode 191 may be connected to the drain electrode 175 through the opening 185.

The test metal pattern 1400 may be disposed in the peripheral area PA. The test metal pattern 1400 may be disposed on the substrate 110, and the gate insulating layer 141 may be disposed between the substrate 110 and the test metal pattern 1400. The test metal pattern 1400 may be disposed on the same layer and include the same material as the source electrode 173 and the drain electrode 175. The passivation layer 180 may be disposed on the test metal pattern 1400.

The present exemplary embodiment is not limited to the present example, and the position of the test metal pattern 1400 can be variously changed without deviating from the scope of the present disclosure. For example, the test metal pattern 1400 may be disposed on the same layer as the gate electrode 125 or on the same layer as the pixel electrode 191. Alternatively, the test metal pattern 1400 may be disposed in a plurality of different layers.

While the present disclosure has been described in connection with the exemplary embodiments, it is to be understood that the present disclosure is not limited to the disclosed exemplary embodiments. On the contrary, it is intended to cover various modifications and equivalent arrangements included within the spirit and scope of the present disclosure including the appended claims.

<Description of symbols>

| | |
|---|---|
| 110: substrate | 120: marker |
| 130: photoresist | 140: metal layer |
| 1000: photomask | 1100: mask substrate |
| 1210, 2210, 3210: first test pattern | |
| 1220, 2220, 3220: second test pattern | |
| 1230: third test pattern | |
| 1240: fourth test pattern | |
| 1300: test resist pattern | |
| 1310, 2310, 3310: first test resist pattern | |
| 1320, 2320, 3320: second test resist pattern | |
| 1330, 2330, 3330: third test resist pattern | |
| 1340: fourth test resist pattern | |
| 1350: fifth test resist pattern | |
| 1360: sixth test resist pattern | |
| 1400: test metal pattern | |
| 1410, 2410, 3410: first test metal pattern | |
| 1420, 2420, 3420: second test resist pattern | |
| 1430, 2430, 3430: third test resist pattern | |
| 1440: fourth test resist pattern | |
| 1450: fifth test resist pattern | |
| 1460: sixth test resist pattern | |

What is claimed is:

1. A photomask comprising:
a mask substrate; and
a first test pattern and a second test pattern disposed along a first edge of the mask substrate,
wherein the first test pattern has a first outer shape and a first inner shape,
wherein the second test pattern has a second outer shape, and
wherein the second outer shape of the second test pattern is larger than the first inner shape of the first test pattern and smaller than the first outer shape of the first test pattern.

2. The photomask of claim 1, wherein:
each of the first outer shape of the first test pattern, the first inner shape of the first test pattern, and the second outer shape of the second test pattern has a square shape,
a first length of one side of the second outer shape of the second test pattern is longer than a second length of one side of the first inner shape of the first test pattern and shorter than a third length of one side of the first outer shape of the first test pattern.

3. The photomask of claim 1, wherein:
the second test pattern further has a second inner, and
the second inner shape of the second test pattern is smaller than the first inner shape of the first test pattern.

4. The photomask of claim 3, wherein:

each of the first outer shape of the first test pattern, the first inner shape of the first test pattern, the second outer shape of the second test pattern, and the second inner shape of the second test pattern has a square shape, a first length of one side of the second outer shape of the second test pattern is longer than a second length of one side of the first inner shape of the first test pattern and is shorter than a third length of one side of the first outer shape of the first test pattern, and a fourth length of one side of the second inner shape of the second test pattern is shorter than the second length of one side of the first inner shape of the first test pattern.

5. The photomask of claim 1, further comprising:

a third test pattern and a fourth test pattern disposed along a second edge facing the first edge of the mask substrate, the first test pattern and the third test pattern are disposed on a first imaginary line that extends parallel to a third edge connecting the first edge and the second edge of the mask substrate, and the second test pattern and the fourth test pattern are disposed on a second imaginary line that extends parallel to the third edge.

6. The photomask of claim 5, wherein:

the third test pattern has substantially the same shape as the first test pattern, and the fourth test pattern has substantially the same shape as the second test pattern.

7. The photomask of claim 5, wherein:

the first test pattern and the third test pattern are shifted in a direction perpendicular to the first imaginary line, the first test pattern at least partially overlaps the second test pattern, and the third test pattern at least partially overlaps the fourth test pattern.

\* \* \* \* \*